(12) United States Patent
Horiguchi et al.

(10) Patent No.: US 11,711,025 B2
(45) Date of Patent: Jul. 25, 2023

(54) POWER SEMICONDUCTOR MODULE AND POWER CONVERSION APPARATUS INCLUDING THE SAME

(71) Applicant: Mitsubishi Electric Corporation, Chiyoda-ku (JP)

(72) Inventors: Takeshi Horiguchi, Chiyoda-ku (JP); Takayoshi Miki, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 371 days.

(21) Appl. No.: 16/958,836

(22) PCT Filed: Nov. 1, 2018

(86) PCT No.: PCT/JP2018/040702
§ 371 (c)(1),
(2) Date: Jun. 29, 2020

(87) PCT Pub. No.: WO2019/163205
PCT Pub. Date: Aug. 29, 2019

(65) Prior Publication Data
US 2020/0395867 A1  Dec. 17, 2020

(30) Foreign Application Priority Data

Feb. 20, 2018  (JP) .................... 2018-028035

(51) Int. Cl.
*H02M 7/217* (2006.01)
*H02M 1/08* (2006.01)
(Continued)

(52) U.S. Cl.
CPC .............. *H02M 7/217* (2013.01); *G01K 1/14* (2013.01); *G01K 7/24* (2013.01); *H02M 1/08* (2013.01);
(Continued)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 4,334,254 A * 6/1982 Baker .................... H02M 7/538
363/133
5,172,310 A * 12/1992 Deam .................... H01L 25/115
257/E23.141
(Continued)

FOREIGN PATENT DOCUMENTS

EP         0488201     *  6/1992
EP         2605389 A1  *  6/2013  ............ H02M 5/297
(Continued)

OTHER PUBLICATIONS

Japanese Office Action dated Apr. 5, 2019 in Japanese Patent Application No. 2018-028035 filed on Feb. 20, 2018 (with unedited computer generated English translation), 7 pages.
(Continued)

*Primary Examiner* — Kevin J Comber
*Assistant Examiner* — Nusrat Quddus
(74) *Attorney, Agent, or Firm* — Xsensus LLP

(57) ABSTRACT

A power semiconductor module includes at least one upper arm provided between a positive electrode line and a node and including a power semiconductor device and a freewheeling diode connected in parallel, at least one lower arm provided between a negative electrode line and the node and including a power semiconductor device and a freewheeling diode connected in parallel, and a snubber circuit provided between the positive electrode line and the negative electrode line. The snubber circuit includes a snubber capacitor and a snubber resistor connected in series. At least one control terminal outputs a voltage representing the tempera-
(Continued)

ture of the snubber resistor or a voltage related to the temperature of the snubber resistor to a driver that drives the power semiconductor device.

19 Claims, 18 Drawing Sheets

(51) Int. Cl.
H02M 1/34 (2007.01)
G01K 1/14 (2021.01)
G01K 7/24 (2006.01)
H03F 3/45 (2006.01)
H03K 5/24 (2006.01)

(52) U.S. Cl.
CPC .......... *H02M 1/34* (2013.01); *H03F 3/45475* (2013.01); *H03K 5/24* (2013.01)

(58) Field of Classification Search
CPC ... G05F 1/445; G05F 1/66; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 1/10; H02M 3/33561; H02M 7/003; H02M 5/40; H02M 5/42; H02M 5/453; H02M 7/7575; H02M 5/458; H02M 5/45; H02M 5/4585; H02M 5/4505; H02M 5/451; H02M 5/452; H02M 5/447; H02M 5/456; H02M 1/12; H02M 1/4266; H02M 2001/123; H02M 3/073; H02M 3/137; H02M 3/28; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/04; H02M 7/00; H05B 39/048; G06F 1/263; H01R 13/6675; H01R 29/00; H01R 31/065; H02K 11/046; H05K 7/20927; H04B 2215/069; H01L 25/112; H01L 25/115; H01L 23/34; H01F 2027/406; H02H 7/268; H02J 3/36; H02J 3/01

See application file for complete search history.

(56) References Cited

U.S. PATENT DOCUMENTS

| | | | | |
|---|---|---|---|---|
| 5,258,902 A * | 11/1993 | Lindbery | ......... | H03K 17/08148 363/56.12 |
| 5,841,645 A * | 11/1998 | Sato | ...................... | H02M 7/487 363/43 |
| 5,953,222 A * | 9/1999 | Mizutani | ............... | H03K 17/567 363/56.05 |
| 6,304,475 B1 * | 10/2001 | Iwata | .................... | H01S 3/0975 363/58 |
| 6,320,362 B1 * | 11/2001 | Baek | ................ | H03K 17/08148 323/289 |
| 8,890,453 B2 * | 11/2014 | Kure | ................... | H02M 3/3376 318/400.2 |
| 9,768,678 B1 * | 9/2017 | Stanley | ............... | H02M 3/1588 |
| 9,837,952 B1 * | 12/2017 | Carcia | .................... | H02P 27/08 |
| 10,007,288 B2 * | 6/2018 | Gazit | ..................... | H02M 7/44 |
| 10,224,808 B2 * | 3/2019 | Torii | ...................... | H02M 1/14 |
| 11,482,997 B2 * | 10/2022 | Sim | ....................... | H02H 3/087 |
| 2005/0128671 A1 | 6/2005 | Miyamoto | ............ | H02M 7/538 361/118 |
| 2005/0180179 A1 * | 8/2005 | Hirst | ..................... | H02M 5/293 363/21.07 |
| 2007/0297202 A1 * | 12/2007 | Zargari | ................... | H02M 1/32 363/50 |
| 2011/0310645 A1 * | 12/2011 | Godo | ............... | H03K 17/08148 363/56.12 |
| 2012/0020025 A1 * | 1/2012 | Sotome | .................. | H01G 4/228 361/704 |
| 2012/0147641 A1 * | 6/2012 | Yamaguchi | ............. | H02M 1/34 363/132 |
| 2012/0307532 A1 * | 12/2012 | Godo | .................. | H01L 27/0688 363/37 |
| 2013/0049654 A1 * | 2/2013 | Kure | ..................... | B60L 15/007 318/400.2 |
| 2013/0062626 A1 * | 3/2013 | Takao | ................. | H01L 21/8258 257/77 |
| 2013/0188404 A1 * | 7/2013 | Nakamura | ............. | H02M 5/458 363/37 |
| 2013/0229840 A1 * | 9/2013 | Nakamori | ............... | H02M 1/32 363/50 |
| 2013/0293287 A1 * | 11/2013 | Zhu | ........................ | H02M 1/08 327/538 |
| 2014/0133200 A1 * | 5/2014 | Sun | ........................ | H02M 1/34 363/50 |
| 2014/0167720 A1 * | 6/2014 | Chiang | ................. | H02M 3/158 323/282 |
| 2014/0184303 A1 * | 7/2014 | Hasegawa | ......... | H01L 23/49562 327/377 |
| 2014/0284781 A1 * | 9/2014 | Asaoka | ................ | H01L 23/562 257/676 |
| 2015/0155276 A1 * | 6/2015 | Takao | ................... | H02M 7/003 257/140 |
| 2015/0222262 A1 * | 8/2015 | Hanamura | ............. | B60L 3/003 327/109 |
| 2016/0255714 A1 * | 9/2016 | Hiramitsu | ............. | H02M 7/003 361/709 |
| 2017/0063071 A1 * | 3/2017 | Yoneyama | ............ | H02H 7/222 |
| 2017/0229572 A1 * | 8/2017 | Nagase | ................ | H01L 29/404 |
| 2017/0229953 A1 * | 8/2017 | Otake | .................. | H02M 7/5387 |
| 2017/0302190 A1 * | 10/2017 | Ikarashi | ................. | H05K 7/209 |
| 2017/0338734 A1 * | 11/2017 | Nakashima | ............. | H02M 1/34 |
| 2018/0019672 A1 * | 1/2018 | Luo | ........................ | H02M 1/34 |
| 2018/0062541 A1 * | 3/2018 | Kaneda | ................ | H03K 17/166 |
| 2018/0090473 A1 * | 3/2018 | Nakahara | .......... | H01L 23/49524 |
| 2018/0097440 A1 * | 4/2018 | Wang | .................. | H02M 7/53871 |
| 2019/0007041 A1 * | 1/2019 | Erlbach | ............... | H01L 29/732 |
| 2019/0199241 A1 * | 6/2019 | Murakami | ............. | H02M 1/34 |
| 2019/0206810 A1 * | 7/2019 | Kanai | ..................... | H01L 23/60 |
| 2019/0334430 A1 * | 10/2019 | Higashiyama | .......... | H02M 1/34 |
| 2020/0006237 A1 * | 1/2020 | Nakano | ............... | H01L 23/5389 |
| 2020/0066697 A1 * | 2/2020 | Yoshimura | .............. | H01L 28/40 |
| 2020/0083801 A1 * | 3/2020 | Shimizu | ............... | H01L 25/162 |
| 2020/0395842 A1 * | 12/2020 | Evans | .................... | H02M 1/34 |
| 2021/0006062 A1 * | 1/2021 | Schlueter | ......... | H03K 17/08142 |
| 2021/0011090 A1 * | 1/2021 | Sato | ................ | H02M 3/1588 |
| 2021/0143147 A1 * | 5/2021 | Nakano | ................ | H01L 23/642 |

(56) References Cited

U.S. PATENT DOCUMENTS

| | | | | |
|---|---|---|---|---|
| 2021/0249389 A1* | 8/2021 | Goto | .................. | H01L 24/32 |
| 2022/0190706 A1* | 6/2022 | Igarashi | ............. | H03K 17/0822 |

FOREIGN PATENT DOCUMENTS

| | | | | | |
|---|---|---|---|---|---|
| JP | 2-84344 | U | | 6/1990 | |
| JP | 4-271271 | A | | 9/1992 | |
| JP | 6-303762 | A | | 10/1994 | |
| JP | H10 23744 | | * | 7/1996 | |
| JP | 2002-119044 | | * | 10/2000 | |
| JP | 2005-51960 | | * | 7/2003 | |
| JP | 2004-104860 | | * | 4/2004 | |
| JP | 2013-045882 | | * | 8/2011 | |
| JP | 2012-210153 | A | | 10/2012 | |
| JP | 2014-128066 | | * | 12/2012 | |
| JP | 2015-095963 | | * | 11/2013 | |
| JP | 5704121 | B2 | | 4/2015 | |
| WO | WO 2006-003936 | | * | 8/2007 | |
| WO | WO-2012060123 | A1 | * | 5/2012 | ............ B62D 5/0406 |
| WO | WO-2016027557 | A1 | * | 2/2016 | ............ H01L 23/36 |
| WO | WO-2016104533 | A1 | * | 6/2016 | ............ H02M 1/34 |
| WO | WO-2016111260 | A1 | * | 7/2016 | ............ H02M 1/32 |
| WO | WO-2018194153 | A1 | * | 10/2018 | ............ H01G 4/228 |
| WO | WO-2019163205 | A1 | * | 8/2019 | ............ G01K 1/14 |
| WO | WO 2019 202922 | | * | 10/2019 | |
| WO | WO-2020255249 | A1 | * | 12/2020 | ......... H02M 1/0009 |

OTHER PUBLICATIONS

International Search Report dated Jan. 22, 2019 in PCT/JP2018/040702 filed on Nov. 1, 2018, 1 page.
German Office Action dated Dec. 5, 2022 in corresponding German Patent Application No. 11 2018 007 125.1 (with English translation), 15 pages.

* cited by examiner

POWER SEMICONDUCTOR MODULE AND POWER CONVERSION APPARATUS INCLUDING THE SAME

TECHNICAL FIELD

The present disclosure relates to a power semiconductor module and a power conversion apparatus including the same, and more particularly to a power semiconductor module with a snubber circuit mounted between a positive electrode and a negative electrode and a power conversion apparatus including the same.

BACKGROUND ART

In power semiconductor modules, it is known that voltage ringing occurs at the time when switching devices turn-on and turn-off. Such voltage ringing may lead to breakage of power semiconductor modules when the peak value of the ringing voltage is higher than the rated voltage. In addition, it may generate EMI noise.

Suppression of ringing is an important issue in particular in wide-bandgap semiconductors such as SiC-MOSFETs (metal oxide semiconductor field effect transistors) in order to maximize their capability.

In order to suppress ringing, it is known that a power semiconductor module contains a snubber circuit including a snubber capacitor and a snubber resistor connected in series to absorb resonant energy. However, when resonant energy involved with ringing is large, high power dissipation in the snubber resistor may break the snubber resistor, resulting in a malfunction of the snubber circuit.

In this respect, a power semiconductor module described in PTL 1 monitors the voltage across a snubber capacitor and outputs a monitored voltage to a control unit external to the power semiconductor module. The control unit controls a DC-DC converter in accordance with the level of the monitored voltage and controls a voltage applied between the P-side terminal and the N-side terminal of the power semiconductor module. An input voltage to the power semiconductor module is thus controlled.

CITATION LIST

Patent Literature

PTL 1: Japanese Patent No. 5704121

SUMMARY OF INVENTION

Technical Problem

Unfortunately, in PTL 1, since the voltage across the snubber capacitor is a high voltage of a few hundreds of volts, the monitored voltage output to the outside is a high voltage. It is therefore necessary to provide a circuit that divides the voltage across the snubber capacitor and outputs the divided voltage as a monitored voltage. As a result, the circuit configuration of the power semiconductor module is complicated.

An object of the present disclosure is therefore to provide a power semiconductor module capable of suppressing voltage ringing with a simple configuration and a power conversion apparatus including the same.

Solution to Problem

A power semiconductor module in the present disclosure includes at least one upper arm disposed between a positive electrode line and a node and including a power semiconductor device and a freewheeling diode connected in parallel, at least one lower arm disposed between a negative electrode line and the node and including a power semiconductor device and a freewheeling diode connected in parallel, and a snubber circuit disposed between the positive electrode line and the negative electrode line. The snubber circuit includes a snubber capacitor and a snubber resistor connected in series. The power semiconductor module includes at least one control terminal for outputting a voltage representing a temperature of the snubber resistor or a voltage related to a temperature of the snubber resistor to a driver that drives the power semiconductor device.

Advantageous Effects of Invention

According to the present disclosure, since at least one control terminal is provided for outputting a voltage representing the temperature of the snubber resistor or a voltage related to the temperature of the snubber resistor to a driver for driving the power semiconductor device, the driving of the power semiconductor device can be controlled in accordance with the temperature of the snubber resistor while ringing is suppressed with a simple configuration.

DESCRIPTION OF EMBODIMENTS

Embodiments will be described below with reference to the figures.

First Embodiment

Figure 1:
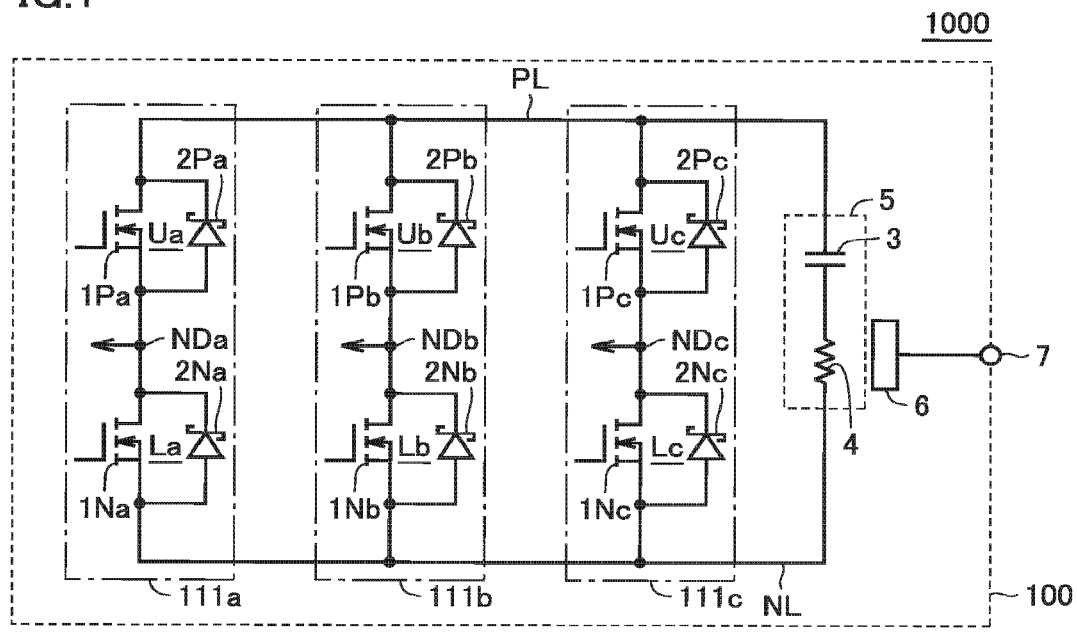
FIG. 1 is a diagram showing a circuit configuration of a power conversion apparatus 1000 in a first embodiment.

FIG. 1 is a diagram showing a circuit configuration of a power conversion apparatus 1000 in a first embodiment.

Power conversion apparatus 1000 includes a power semiconductor module 100.

Power semiconductor module 100 includes a first leg 111a, a second leg 111b, a third leg 111c, a CR snubber circuit 5, a temperature detector 6, and a first control terminal 7.

First leg 111a includes a power semiconductor device 1Pa on the positive electrode side, a freewheeling diode 2Pa on the positive electrode side, a power semiconductor device 1Na on the negative electrode side, and a freewheeling diode 2Na on the negative electrode side. Power semiconductor device 1Pa and freewheeling diode 2Pa are connected in antiparallel between a positive electrode line PL and a node NDa to configure a first upper arm Ua. Power semiconductor device 1Na and freewheeling diode 2Na are connected in antiparallel between node NDa and a negative electrode line NL to configure a first lower arm La.

Second leg 111b includes a power semiconductor device 1Pb on the positive electrode side, a freewheeling diode 2Pb on the positive electrode side, a power semiconductor device 1Nb on the negative electrode side, and a freewheeling diode 2Nb on the negative electrode side. Power semiconductor device 1Pb and freewheeling diode 2Pb are connected in antiparallel between positive electrode line PL and a node NDb to configure a second upper arm Ub. Power semiconductor device 1Nb and freewheeling diode 2Nb are connected in antiparallel between node NDb and negative electrode line NL to configure a second lower arm Lb.

Third leg 111c includes a power semiconductor device Pc on the positive electrode side, a freewheeling diode 2Pc on the positive electrode side, a power semiconductor device 1Nc on the negative electrode side, and a freewheeling diode 2Nc on the negative electrode side. Power semiconductor device 1Pc and freewheeling diode 2Pc are connected in antiparallel between positive electrode line PL and anode NDc to configure a third upper arm Uc. Power semiconductor device 1Nc and freewheeling diode 2Nc are connected in antiparallel between node NDc and negative electrode line NL to configure a third lower arm Lc.

Node NDa, node NDb, and node NDc are connected to a load external to power semiconductor module 100.

In the following description, power semiconductor devices 1Pa, 1Na, 1Pb, 1Nb, 1Pc, and 1Nc are collectively referred to as power semiconductor device 1, and freewheeling diodes 2Pa, 2Na, 2Pb, 2Nb, 2Pc, and 2Nc are collectively referred to as freewheeling diode 2.

A MOSFET can be used as power semiconductor device 1, and a Schottky barrier diode (SBD) can be used as freewheeling diode 2. Hereinafter, MOSFET will be described as an example of power semiconductor device 1, but power semiconductor device 1 is not limited to MOSFET and may be an insulated gate bipolar transistor (IGBT). A SiC-MOSFET may be used as power semiconductor device 1, and a SiC-SBD may be used as freewheeling diode 2.

It is known that when a SiC-SBD is used as freewheeling diode 2, ringing occurs due to resonance caused by the parasitic inductance of power semiconductor module 100 and the capacitor of the SiC-SBD. When the peak value of such ringing voltage exceeds the rated voltage of the power semiconductor module, breakage of the module may occur. Ringing may also be the cause of EMI noise. It is therefore necessary to minimize voltage ringing. Suppression of ringing is not limited to the case where a SiC-SBD is used as freewheeling diode 2.

CR snubber circuit 5 is disposed between positive electrode line PL and negative electrode line NL in order to suppress ringing. CR snubber circuit 5 includes a snubber capacitor 3 and a snubber resistor 4 connected in series between positive electrode line PL and negative electrode line NL.

When CR snubber circuit 5 is used, resonant energy involved with ringing is absorbed by snubber resistor 4 and thereby the amplitude attenuates, while energy is dissipated in snubber resistor 4. When ringing is large, high power dissipation in snubber resistor 4 may break the snubber resistor, resulting in a malfunction of the snubber circuit.

In order to prevent breakage of snubber resistor 4, temperature detector 6 located close to snubber resistor 4 detects the temperature of snubber resistor 4 and outputs a voltage representing the detected temperature from first control terminal 7 to the outside of power semiconductor module 100. For example, temperature detector 6 may be a thermistor but is not limited to a thermistor.

According to the present embodiment, the temperature of the snubber resistor is output to the outside of the power semiconductor module. On the outside, power semiconductor device 1 can be controlled such that ringing occurred by switching operation is reduced, in accordance with the temperature of the snubber resistor.

Although the power semiconductor module in the first embodiment includes three legs and one snubber circuit, the present disclosure is not limited thereto. A snubber circuit may be provided for each leg. Alternatively, the power semiconductor module may include one leg and one snubber circuit.

First Modification of First Embodiment

Figure 2:
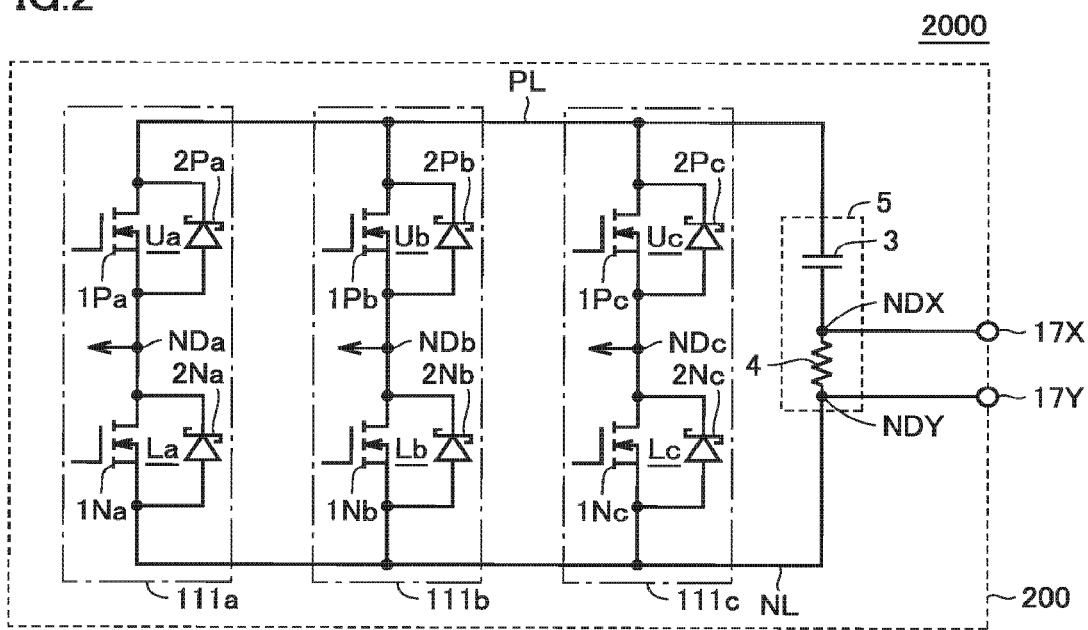
FIG. 2 is a diagram illustrating a circuit configuration of a power conversion apparatus 2000 in a first modification of the first embodiment.

FIG. 2 is a diagram illustrating a circuit configuration of a power conversion device 2000 in a first modification of the first embodiment.

Power conversion apparatus 2000 includes a power semiconductor module 200.

In the present modification, in place of temperature detector 6 detecting the temperature of snubber resistor 4, the voltage across snubber resistor 4 is detected. Since the value of snubber resistor 4 is known, power dissipation in snubber resistor 4 can be calculated by detecting the voltage of snubber resistor 4. Since the power dissipation in snubber resistor 4 is proportional to the temperature of snubber resistor 4, the temperature of the snubber resistor can be estimated by detecting the voltage across snubber resistor 4.

A node NDX at one end of snubber resistor 4 is connected to a first control terminal 17X, and a node NDY at the other end of snubber resistor 4 is connected to a second control terminal 17Y. The voltage across snubber resistor 4 is output to the outside of power semiconductor module 200 through first control terminal 17X and second control terminal 17Y. On the outside, the temperature of snubber resistor 4 can be estimated based on the voltage across snubber resistor 4. Then, power semiconductor device 1 can be controlled such that ringing occurred by switching operation is reduced, based on the temperature of snubber resistor 4.

Second Modification of First Embodiment

Figure 3:
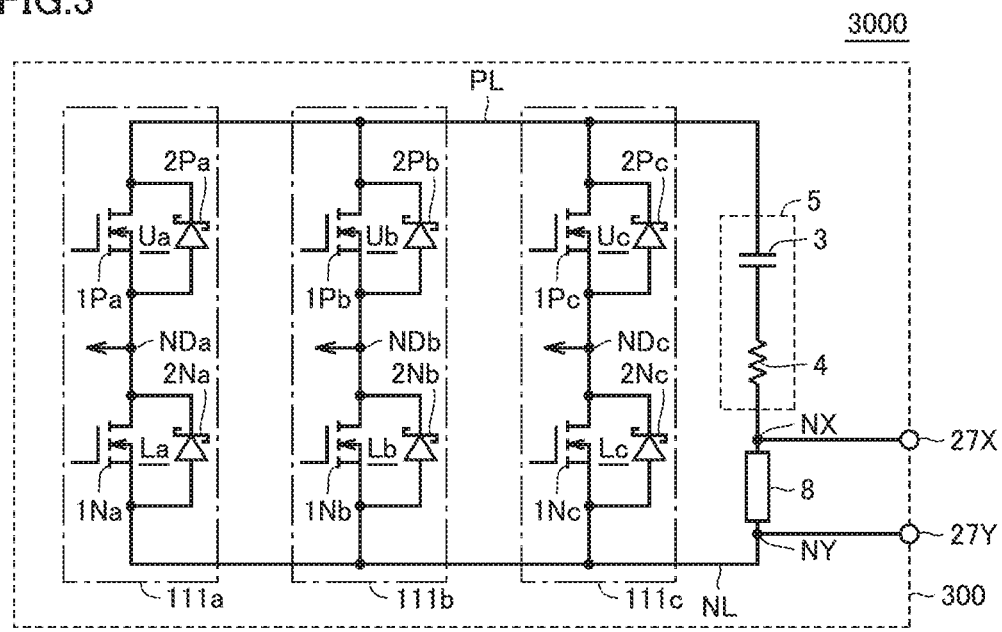
FIG. 3 is a diagram illustrating a circuit configuration of a power conversion apparatus 3000 in a second modification of the first embodiment.

FIG. 3 is a diagram illustrating a circuit configuration of a power conversion apparatus 3000 in a second modification of the first embodiment.

Power conversion apparatus 3000 includes a power semiconductor module 300.

In the present modification, in place of temperature detector 6 detecting the temperature of snubber resistor 4, current flowing through snubber circuit 5 is detected.

Since the value of snubber resistor 4 is known, power dissipation in snubber resistor 4 can be calculated by detecting current flowing through snubber resistor 4. Since the power dissipation in snubber resistor 4 is proportional to the temperature of snubber resistor 4, the temperature of snubber resistor 4 can be estimated by detecting current flowing through snubber resistor 4.

In the present modification, a shunt resistor 8 connected in series with snubber resistor 4 is provided.

A node NX at one end of shunt resistor 8 is connected to a first control terminal 27X, and a node NY at the other end of shunt resistor 8 is connected to a second control terminal 27Y. The voltage across shunt resistor 8 is output to the outside of power semiconductor module 300 through first control terminal 27X and second control terminal 27Y. On the outside, current flowing through shunt resistor 8 and snubber resistor 4 is calculated from the voltage across shunt resistor 8 and the value of shunt resistor 8. The temperature of the snubber resistor can be estimated based on current flowing through snubber resistor 4. Then, power semiconductor device 1 can be controlled such that ringing occurred by switching operation is reduced, based on the temperature of snubber resistor 4.

Second Embodiment

Figure 4:
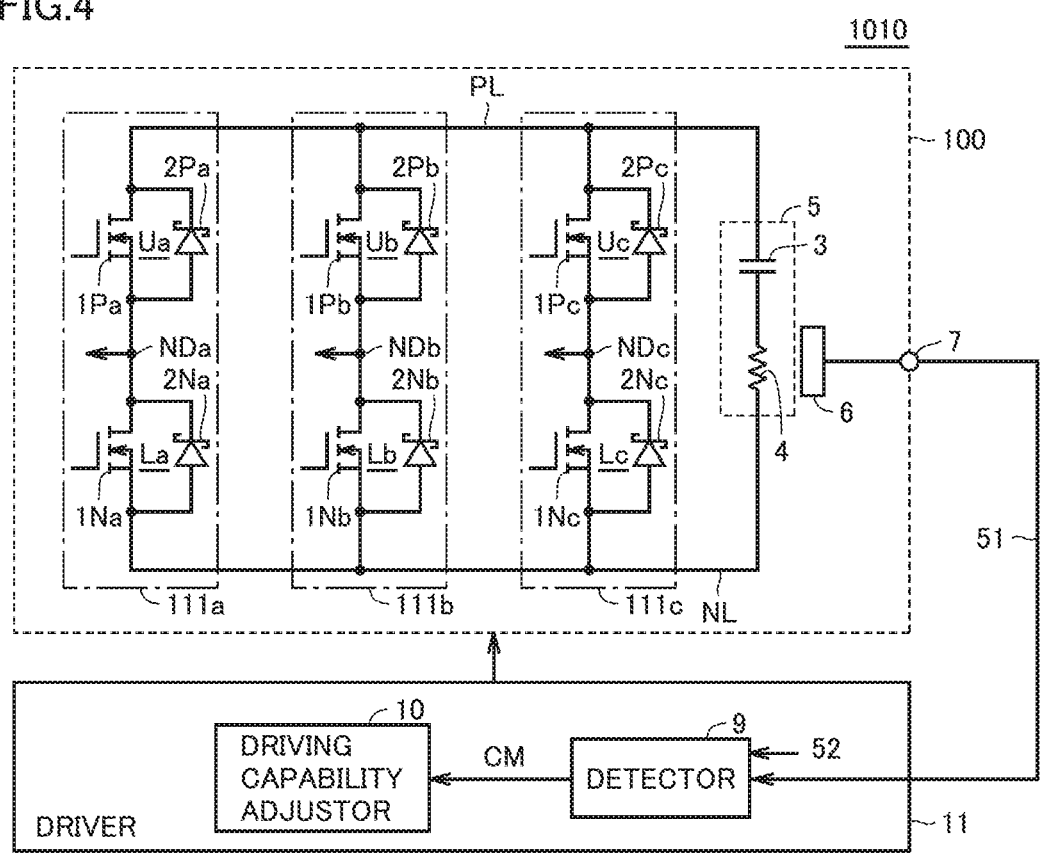
FIG. 4 is a diagram illustrating a circuit configuration of a power conversion apparatus 1010 in a second embodiment.

FIG. 4 is a diagram illustrating a circuit configuration of a power conversion apparatus 1010 in a second embodiment.

Power conversion apparatus 1010 includes a driver 11 in addition to power semiconductor module 100 in the first embodiment. Driver 11 includes a detector 9 and a driving capability adjustor 10.

Figure 5:
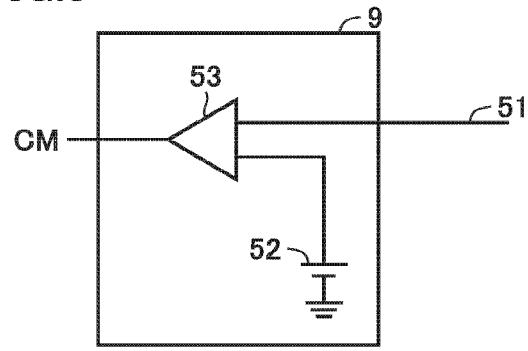
FIG. 5 is a diagram showing a configuration example of a detector 9.

FIG. 5 is a diagram showing a configuration example of detector 9.

Detector 9 includes a comparator 53. Comparator 53 compares voltage 51 representing the temperature output from first control terminal 7 with reference voltage 52 and outputs signal CM representing the comparison result. Signal CM is sent to driving capability adjustor 10. When the magnitude of voltage 51 representing the temperature is equal to or greater than the magnitude of reference voltage 52, comparator 53 outputs signal CM at high level. When the magnitude of voltage 51 representing the temperature is smaller than the magnitude of reference voltage 52, comparator 53 outputs signal CM at low level. Signal CM is sent to driving capability adjustor 10.

Figure 6:
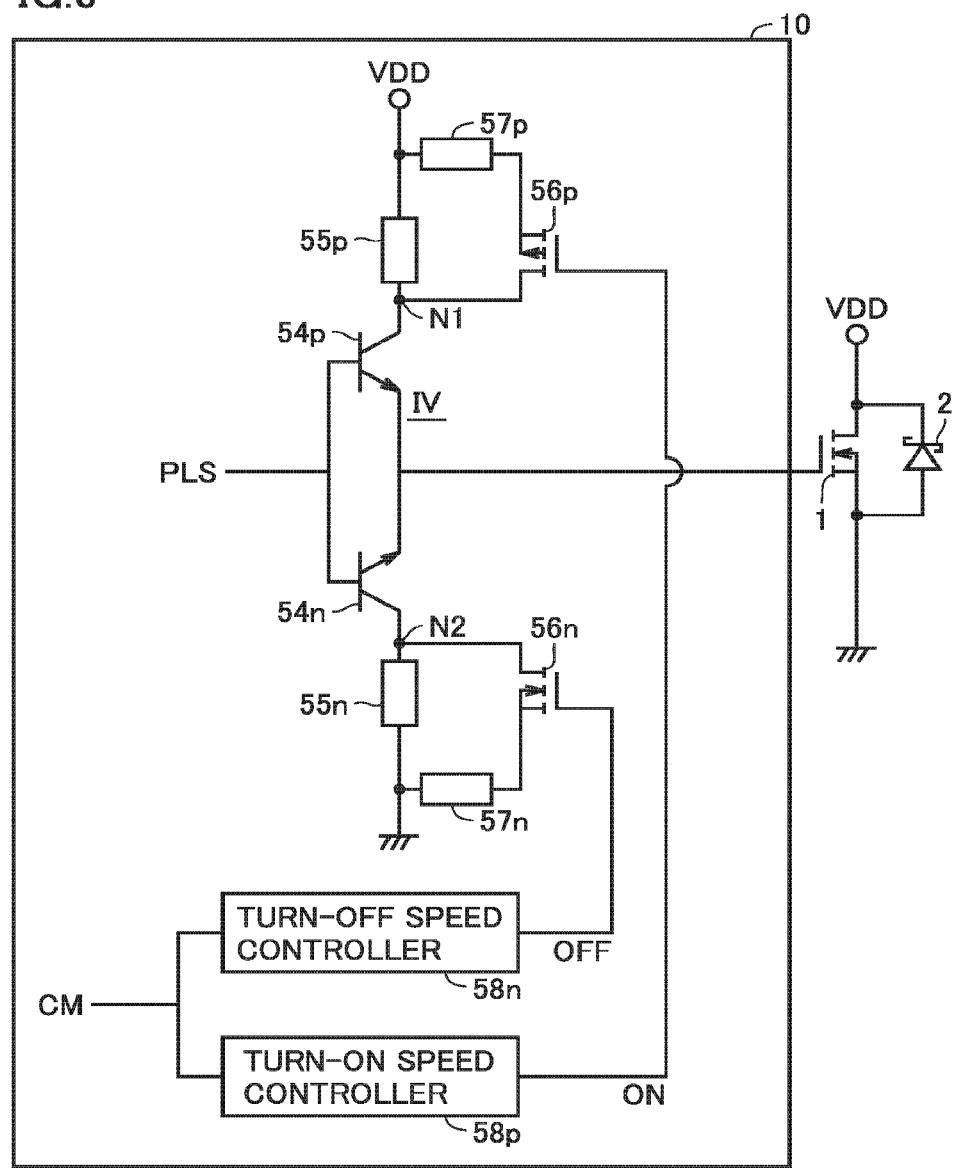
FIG. 6 is a diagram showing a configuration example of a driving capability adjustor 10.

FIG. 6 is a diagram showing a configuration example of driving capability adjustor 10.

Driving capability adjustor 10 includes a turn-on speed controller 58*p*, a turn-off speed controller 58*n*, a first on-gate resistor 55*p*, a second on-gate resistor 57*p*, a 80 first off-gate resistor 55*n*, a second off-gate resistor 57*n*, a P-channel MOSFET 56*p*, an npn transistor 54*p*, an N-channel MOSFET 56*n*, and a pnp transistor 54*n*.

First on-gate resistor 55*p* is disposed between power supply terminal VDD and a node N1. Second on-gate resistor 57*p* and P-channel MOSFET 56*p* are connected in series between power supply terminal VDD and node N1. The gate of P-channel MOSFET 56*p* receives on-signal ON from turn-on speed controller 58*p*.

First off-gate resistor 55*n* is disposed between ground GND and a node N2. Second off-gate resistor 57*n* and N-channel MOSFET 56*n* are connected in series between ground GND and node N2. The gate of N-channel MOSFET 56*n* receives off-signal OFF from turn-off speed controller 58*n*.

Npn transistor 54*p* and pnp transistor 54*n* are connected in series between node N1 and node N2. Pulse signal PLS is input to the gate of npn transistor 54*p* and the gate of pnp transistor 54*n*. The outputs of npn transistor 54*p* and pnp transistor 54*n* are connected to the gate of power semiconductor device 1.

Turn-on speed controller 58*p* outputs on-signal ON having a level changing, in accordance with signal CM from comparator 53. Turn-on speed controller 58*p* outputs on-signal ON at high level to the gate of P-channel MOSFET 56*p* when signal CM from comparator 53 is high level, and outputs on-signal ON at low level to the gate of P-channel MOSFET 56*p* when signal CM from comparator 53 is low level.

Turn-off speed controller 58*n* outputs off-signal OFF having a level changing, in accordance with signal CM from comparator 53. Turn-off speed controller 58*n* outputs off-signal OFF at low level to the gate of N-channel MOSFET 56n when signal CM from comparator 53 is high level, and outputs off-signal OFF at high level to the gate of N-channel MOSFET 56n when signal CM from comparator 53 is low level.

Comparator 53 outputs signal CM at low level in normal operation (temperature) and outputs signal CM at high level when the temperature of snubber resistor 4 rises and a signal of temperature detector 6 is higher than reference voltage 52 corresponding to a reference temperature.

In normal operation, signal CM at low level is output from comparator 53.

When signal CM goes to low level, on-signal ON at low level is output from turn-on speed controller 58p and therefore P-channel MOSFET 56p is conducting. At this time, first on-gate resistor 55p and second on-gate resistor 57p are connected in parallel between power supply terminal VDD and node N1. The combined resistance of first on-gate resistor 55p and second on-gate resistor 57p acts as an on-gate resistor, and power semiconductor device 1 makes turn-on operation in accordance with pulse signal PLS.

When signal CM goes to low level, off-signal OFF at high level is output from turn-off speed controller 58n and therefore N-channel MOSFET 56n is conducting. At this time, first off-gate resistor 55n and second off-gate resistor 57n are connected in parallel between node N2 and ground GND. The combined resistance of first off-gate resistor 55n and second off-gate resistor 57n acts as an off-gate resistor, and power semiconductor device 1 makes turn-off operation in accordance with pulse signal PLS.

On the other hand, signal CM from comparator 53 goes to high level with temperature rise in snubber resistor 4.

When signal CM goes to high level, on-signal ON at high level is output from turn-on speed controller 58p and therefore P-channel MOSFET 56p is turned off. At this time, first on-gate resistor 55p acts as an on-gate resistor, and power semiconductor device 1 makes turn-on operation in accordance with pulse signal PLS. That is, when the temperature of snubber resistor 4 rises and signal CM goes to high level, the on-gate resistance increases and therefore the turn-on operation of power semiconductor device 1 can be slowed. As a result, ringing is suppressed and power dissipation in snubber resistor 4 can be reduced.

When signal CM goes to high level, off-signal OFF at low level is output from turn-off speed controller 58n and therefore N-channel MOSFET 56n is turned off. At this time, first off-gate resistor 55n acts as an off-gate resistor and power semiconductor device 1 makes turn-off operation in accordance with pulse signal PLS. That is, when the temperature of snubber resistor 4 rises and signal CM goes to high level, the off-gate resistance increases and therefore the turn-off operation of power semiconductor device 1 can be slowed. As a result, ringing is suppressed and power dissipation in snubber resistor 4 can be reduced.

The power semiconductor module according to the second embodiment slows the switching speed for each of the turn-on operation and the turn-off operation in accordance with the temperature of the snubber resistor. However, the switching speed may be slowed only for the turn-on operation or the turn-off operation.

When only the switching speed of turn-on operation of power semiconductor device 1 is slowed, N-channel MOSFET 56n, second off-gate resistor 57n, and turn-off speed controller 58n in driving capability adjustor 10 in FIG. 6 are omitted. Similarly, when only the switching speed of turn-off operation is slowed, P-channel MOSFET 56p, second on-gate resistor 57p, and turn-on speed controller 58p in driving capability adjustor 10 in FIG. 6 are omitted.

First Modification of Second Embodiment

Figure 7:
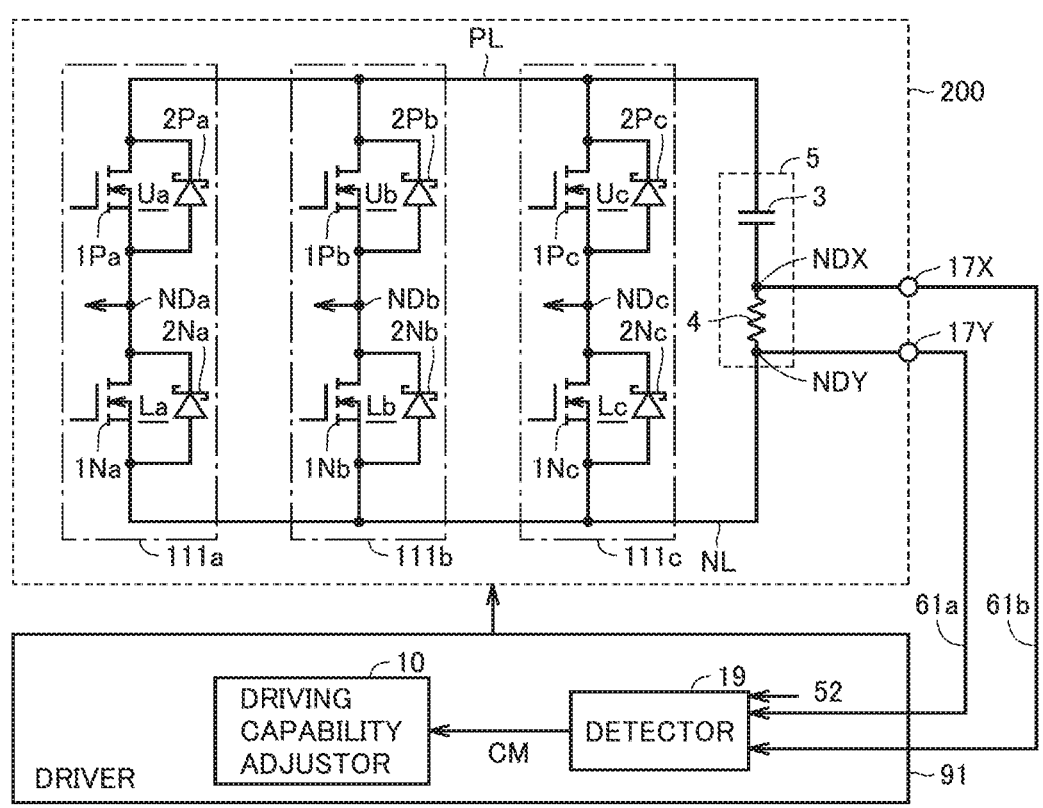
FIG. 7 is a diagram illustrating a circuit configuration of a power conversion apparatus 2010 in a first modification of the second embodiment.

FIG. 7 is a diagram illustrating a circuit configuration of a power conversion apparatus 2010 in a first modification of the second embodiment.

Power conversion apparatus 2010 includes a driver 91 in addition to power semiconductor module 200 in the first modification of the first embodiment. Driver 91 includes a detector 19 and a driving capability adjustor 10. Driving capability adjustor 10 is similar to that in the second embodiment.

Figure 8:
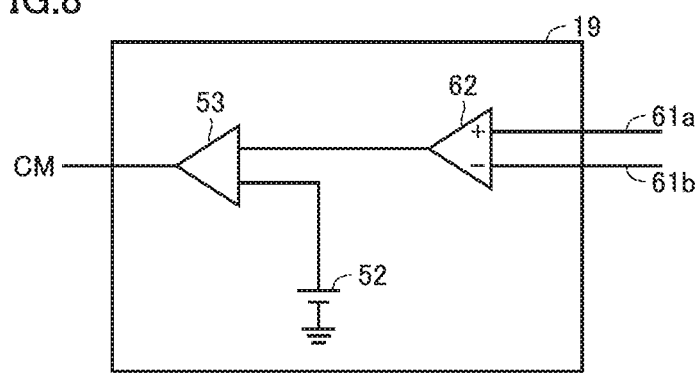
FIG. 8 is a diagram showing a configuration example of a detector 19.

FIG. 8 is a diagram showing a configuration example of detector 19.

Detector 19 includes a differential amplifier circuit 62 and a comparator 53.

Differential amplifier circuit 62 amplifies the voltage difference between the voltage of node NDX output from first control terminal 17X and the voltage of node NDY output from second control terminal 17Y.

Comparator 53 compares the voltage output from differential amplifier circuit 62 with reference voltage 52 and outputs signal CM representing the comparison result. Signal CM is sent to driving capability adjustor 10.

Also in the present modification, since increase in the voltage across snubber resistor 4 corresponds to rise in temperature of snubber resistor 4, signal CM from comparator 53 goes to high level. When the temperature of snubber resistor 4 rises and signal CM goes to high level, the on-gate resistance increases and therefore the turn-on operation of power semiconductor device 1 can be slowed. As a result, ringing is suppressed and power dissipation in snubber resistor 4 can be reduced. When the temperature of snubber resistor 4 rises and signal CM goes to high level, the off-gate resistance increases and therefore the turn-off operation of power semiconductor device 1 can be slowed. As a result, ringing is suppressed and power dissipation in snubber resistor 4 can be reduced.

Second Modification of Second Embodiment

Figure 9:
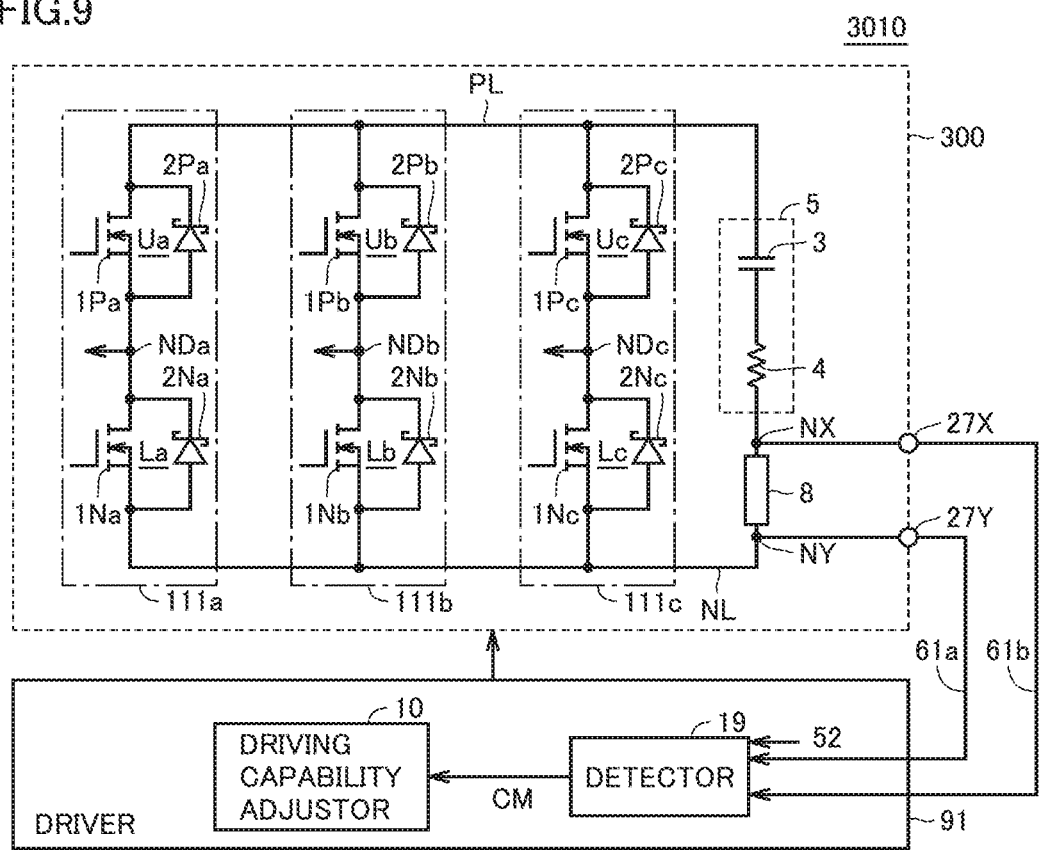
FIG. 9 is a diagram illustrating a circuit configuration of a power conversion apparatus 3010 in a second modification of the second embodiment.

FIG. 9 is a diagram illustrating a circuit configuration of a power conversion apparatus 3010 in a second modification of the second embodiment.

Power conversion apparatus 3010 includes a driver 91 in addition to power semiconductor module 300 in the second modification of the first embodiment. Driver 91 includes a detector 19 and a driving capability adjustor 10. Detector 19 is similar to that in the first modification of the second embodiment. Driving capability adjustor 10 is similar to that in the second embodiment.

Also in the present modification, since increase in the voltage across shunt resistor 8 corresponds to rise in temperature of snubber resistor 4, signal CM from comparator 53 goes to high level. When the temperature of snubber resistor 4 rises and signal CM goes to high level, the on-gate resistance increases and therefore the turn-on operation of power semiconductor device 1 can be slowed. As a result, ringing is suppressed and power dissipation in snubber resistor 4 can be reduced. When the temperature of snubber resistor 4 rises and signal CM goes to high level, the off-gate resistance increases and therefore the turn-off operation of power semiconductor device 1 can be slowed. As a result, ringing is suppressed and power dissipation in snubber resistor 4 can be reduced.

Third Embodiment

Figure 10:
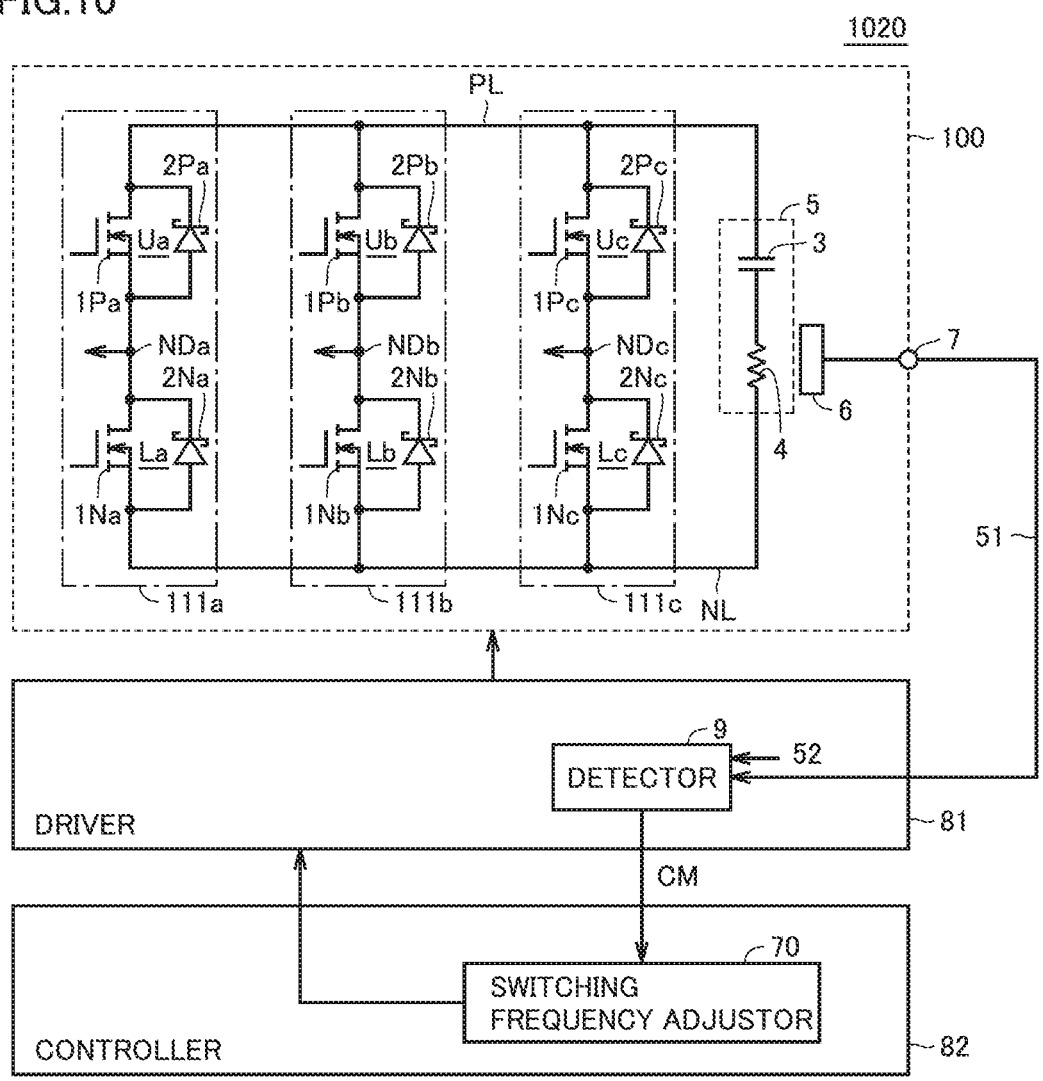
FIG. 10 is a diagram illustrating a circuit configuration of a power conversion apparatus 1020 in a third embodiment.

FIG. 10 is a diagram illustrating a circuit configuration of a power conversion apparatus 1020 in a third embodiment.

Power conversion apparatus 1020 includes a driver 81 and a controller 82 in addition to power semiconductor module 100 in the first embodiment. Driver 81 includes a detector 9. Controller 82 includes a switching frequency adjustor 70.

Detector 9 is similar to that in the second embodiment.

Switching frequency adjustor 70 changes control methods such that the number of times of switching operations per unit time of power semiconductor device 1 is smaller when signal CM from detector 9 is high level than when a signal from detector 9 is low level. As a control method by which the number of times of switching operations per unit time of power semiconductor device 1 is smaller, for example, three-phase modulation is changed to two-phase modulation. Alternatively, the carrier frequency may be reduced. Control is performed such that when comparator 53 outputs signal CM at low level, the switching frequency of power semiconductor device 1 is set to f0, and when comparator 53 outputs signal CM at high level, the switching frequency of power semiconductor device 1 is set to f1 (f0>f1).

In this way, ringing can be suppressed by reducing the number of times of switching operations per unit time of power semiconductor device 1, and consequently, power dissipation in snubber resistor 4 can be reduced.

First Modification of Third Embodiment

Figure 11:
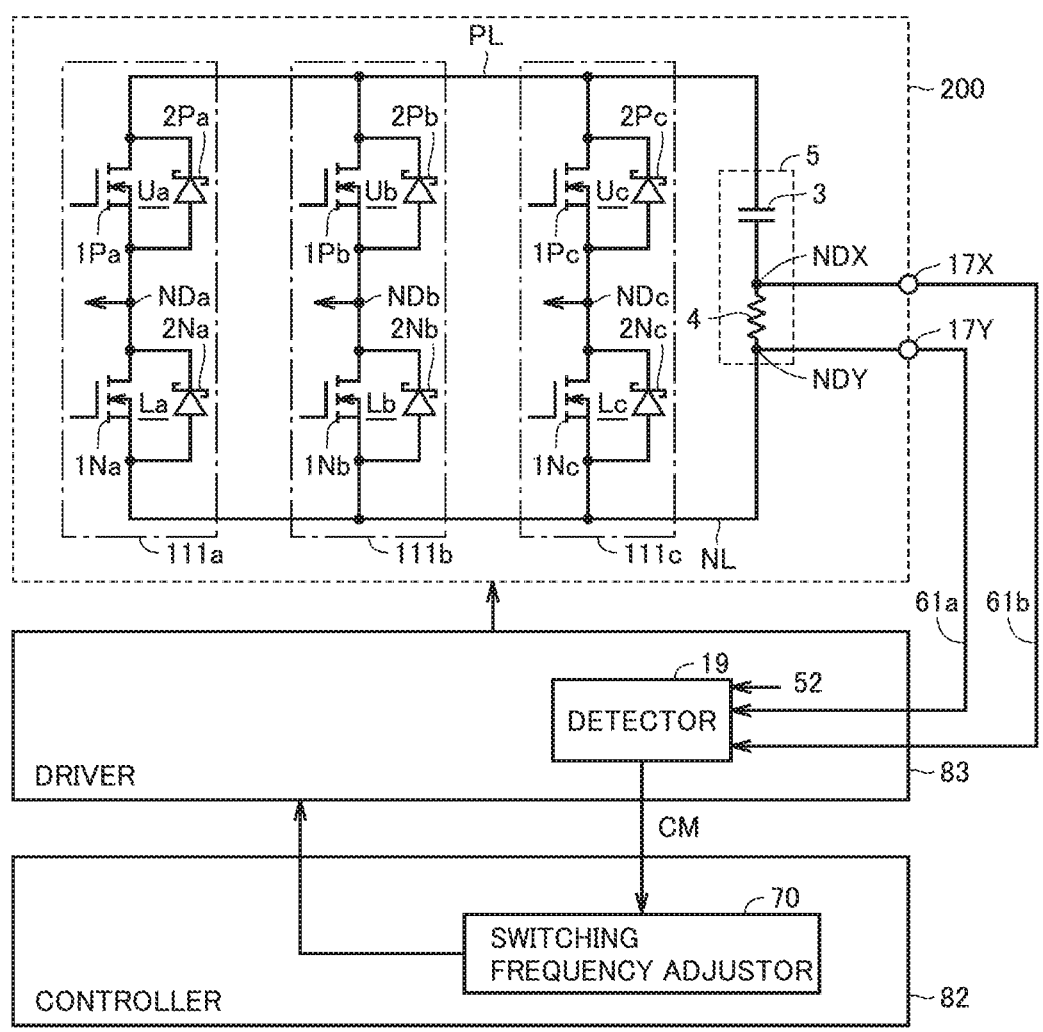
FIG. 11 is a diagram illustrating a circuit configuration of a power conversion apparatus 2020 in a first modification of the third embodiment.

FIG. 11 is a diagram illustrating a circuit configuration of a power conversion apparatus 2020 in a first modification of the third embodiment.

Power conversion apparatus 2020 includes a driver 83 and a controller 82 in addition to power semiconductor module 200 in the first modification of the first embodiment. Driver 83 includes a detector 19. Controller 82 includes a switching frequency adjustor 70.

Detector 19 is similar to that in the first modification of the second embodiment.

Switching frequency adjustor 70 is similar to that in the third embodiment. Ringing can be suppressed by reducing the number of times of switching operations per unit time of power semiconductor device 1, and consequently, power dissipation in snubber resistor 4 can be reduced.

Second Modification of Third Embodiment

Figure 12:
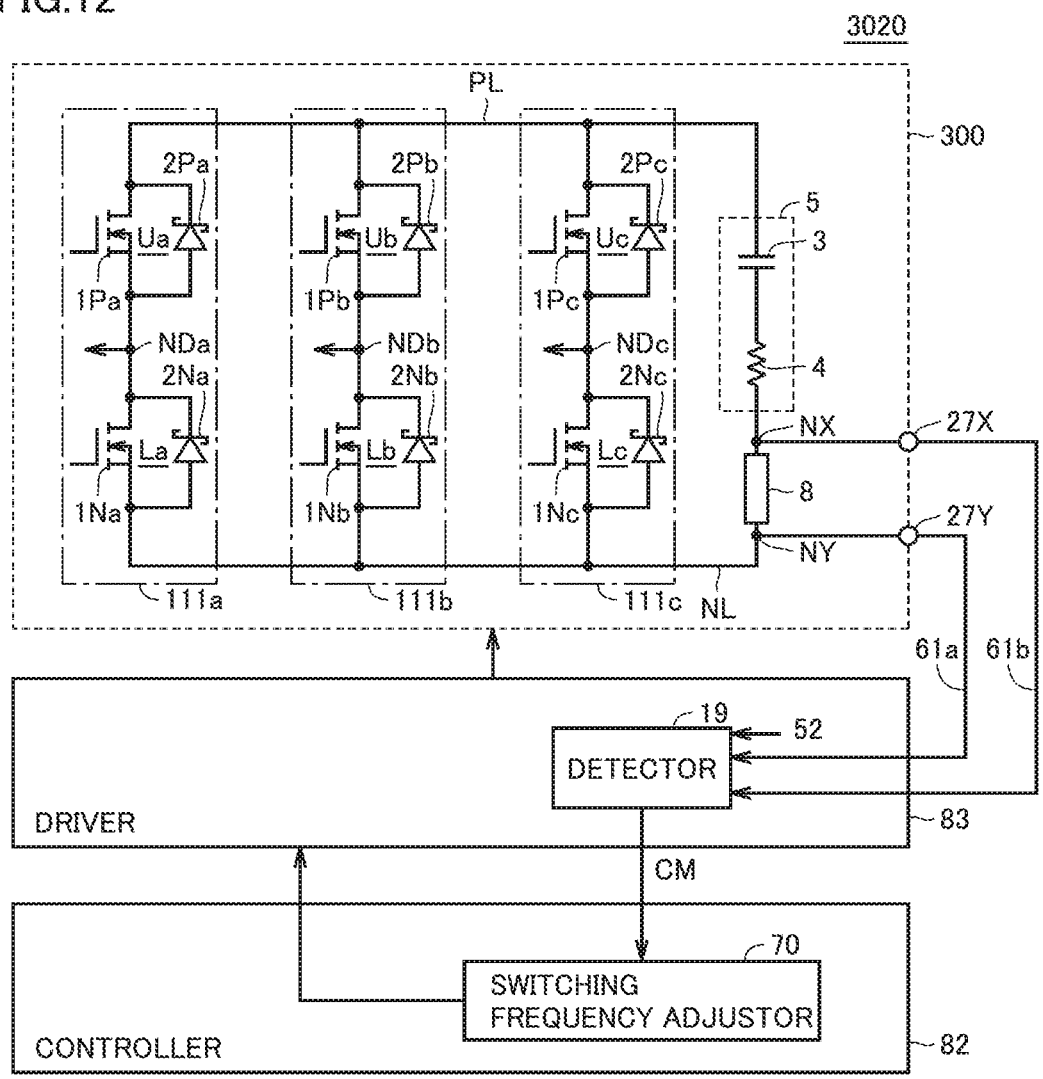
FIG. 12 is a diagram illustrating a circuit configuration of a power conversion apparatus 3020 in a second modification of the third embodiment.

FIG. 12 is a diagram illustrating a circuit configuration of a power conversion apparatus 3020 in a second modification of the third embodiment.

Power conversion apparatus 3020 includes a driver 83 and a controller 82 in addition to power semiconductor module 300 in the second modification of the first embodiment. Driver 83 includes a detector 19. Controller 82 includes a switching frequency adjustor 70.

Detector 19 is similar to that in the first modification of the second embodiment.

Switching frequency adjustor 70 is similar to that in the third embodiment. Ringing can be suppressed by reducing the number of times of switching operations per unit time of power semiconductor device 1, and consequently, power dissipation in snubber resistor 4 can be reduced.

Fourth Embodiment

The present embodiment relates to an example of the arrangement of the internal configuration of power semiconductor module 100 described in the first embodiment.

Figure 13:
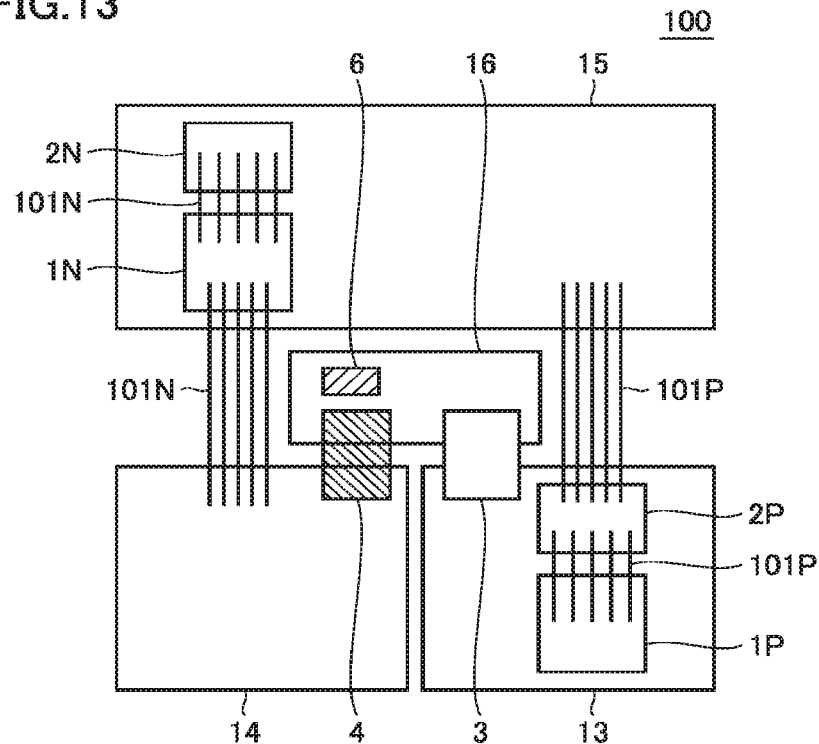
FIG. 13 is a diagram showing an example of the arrangement of the internal configuration of a power semiconductor module 100.

FIG. 13 is a diagram showing an example of the arrangement of the internal configuration of power semiconductor module 100. Although FIG. 13 only shows first leg 111a, second leg 111b and third leg 111c also can be disposed similarly to first leg 111a. Power semiconductor devices 1Pa, 1Na and freewheeling diodes 2Pa, 2Na included in first leg 111a are denoted by 1P, 1N, 2P, and 2N, respectively. This is applicable to the following embodiments.

Power semiconductor device 1P and freewheeling diode 2P are mounted on a positive electrode conductor pattern 13. Power semiconductor device 1P and freewheeling diode 2P are connected to an output conductor pattern 15 through a bonding wire 101P. Power semiconductor device 1N and freewheeling diode 2N are mounted on output conductor pattern 15. Power semiconductor device 1N and freewheeling diode 2N are connected to a negative electrode conductor pattern 14 through a bonding wire 101N. Power semiconductor device 1P and freewheeling diode 2P may be connected to output conductor pattern 15 through a plurality of bonding wires and a not-shown intermediate substrate. Power semiconductor device 1N and freewheeling diode 2N may be connected to negative electrode conductor pattern 14 through a plurality of bonding wires and a not-shown intermediate substrate.

Snubber capacitor 3 is mounted between positive electrode conductor pattern 13 and an intermediate electrode pattern 16. Snubber resistor 4 is mounted between intermediate electrode pattern 16 and negative electrode conductor pattern 14. With such an arrangement, snubber capacitor 3 and snubber resistor 4 are connected in series between positive electrode conductor pattern 13 and negative electrode conductor pattern 14 through intermediate electrode pattern 16.

Temperature detector 6 is mounted in proximity to snubber resistor 4 on intermediate electrode pattern 16. With such a configuration, the temperature of snubber resistor 4 can be detected using temperature detector 6. Temperature detector 6 is connected to the not-shown first control terminal 7.

The positions of snubber capacitor 3 and snubber resistor 4 may be changed each other. Specifically, snubber resistor 4 may be mounted between positive electrode conductor pattern 13 and intermediate electrode pattern 16, snubber capacitor 3 may be mounted between intermediate electrode pattern 16 and negative electrode conductor pattern 14, and temperature detector 6 may be mounted in proximity to snubber resistor 4 on intermediate electrode pattern 16.

Modification of Fourth Embodiment

The present modification relates to another example of the arrangement of the internal configuration of power semiconductor module 100 described in the first embodiment.

Figure 14:
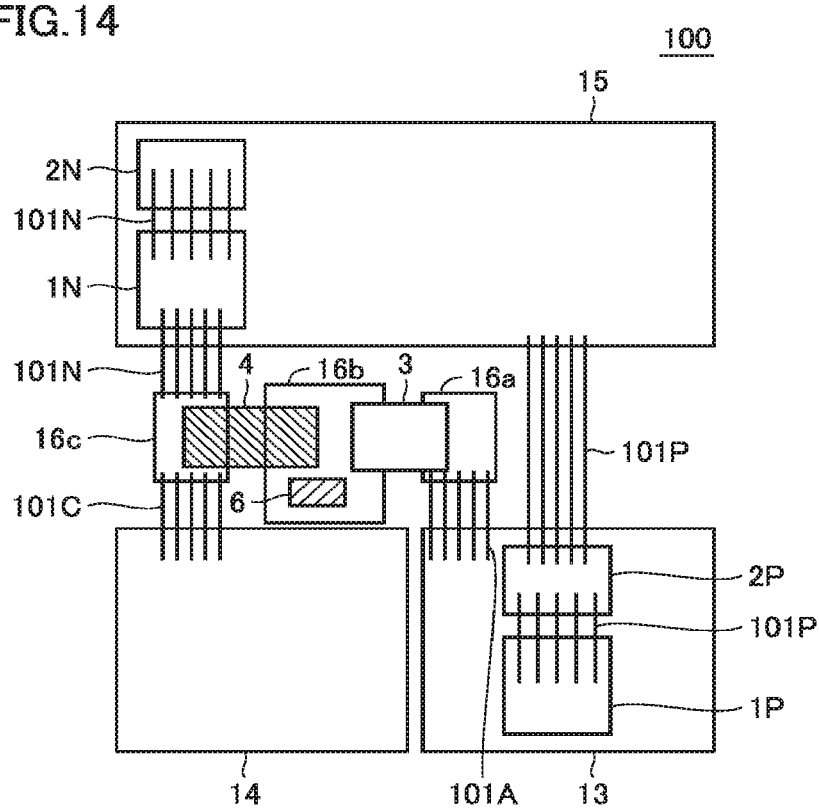
FIG. 14 is a diagram showing another example of the arrangement of the internal configuration of power semiconductor module 100.

FIG. 14 is a diagram showing another example of the arrangement of the internal configuration of power semiconductor module 100.

Power semiconductor device 1P and freewheeling diode 2P are mounted on positive electrode conductor pattern 13. Power semiconductor device 1P and freewheeling diode 2P are connected to output conductor pattern 15 through bonding wire 101P. Power semiconductor device 1N and freewheeling diode 2N are mounted on output conductor pattern 15. Power semiconductor device 1N and freewheeling diode 2N are connected to negative electrode conductor pattern 14 through bonding wires 101N, 101C, and intermediate electrode pattern 16c.

Positive electrode conductor pattern 13 and intermediate electrode pattern 16a are connected through bonding wire 101A. Snubber capacitor 3 is mounted between intermediate electrode pattern 16a and intermediate electrode pattern 16b.

Snubber resistor 4 is mounted between intermediate electrode pattern 16b and intermediate electrode pattern 16c. Intermediate electrode pattern 16c and negative electrode conductor pattern 14 are connected through bonding wire 101C. With such an arrangement, snubber capacitor 3 and snubber resistor 4 are connected in series between positive electrode conductor pattern 13 and negative electrode conductor pattern 14 through intermediate electrode pattern 16a, intermediate electrode pattern 16b, and intermediate electrode pattern 16c.

Temperature detector 6 is mounted in proximity to snubber resistor 4 on intermediate electrode pattern 16b. With such a configuration, the temperature of snubber resistor 4 can be detected using temperature detector 6. Temperature detector 6 is connected to the not-shown first control terminal 7.

Temperature detector 6 may be mounted in proximity to snubber resistor 4 on intermediate electrode pattern 16c.

The positions of snubber capacitor 3 and snubber resistor 4 may be changed each other. Specifically, snubber resistor 4 may be mounted between intermediate electrode pattern 16a and intermediate electrode pattern 16b, snubber capacitor 3 may be mounted between intermediate electrode pattern 16b and intermediate electrode pattern 16c, and temperature detector 6 may be mounted in proximity to snubber resistor 4 on intermediate electrode pattern 16a or intermediate electrode pattern 16b.

Fifth Embodiment

The present embodiment relates to an example of the arrangement of the internal configuration of power semiconductor module 200 described in the first modification of the first embodiment.

Figure 15:
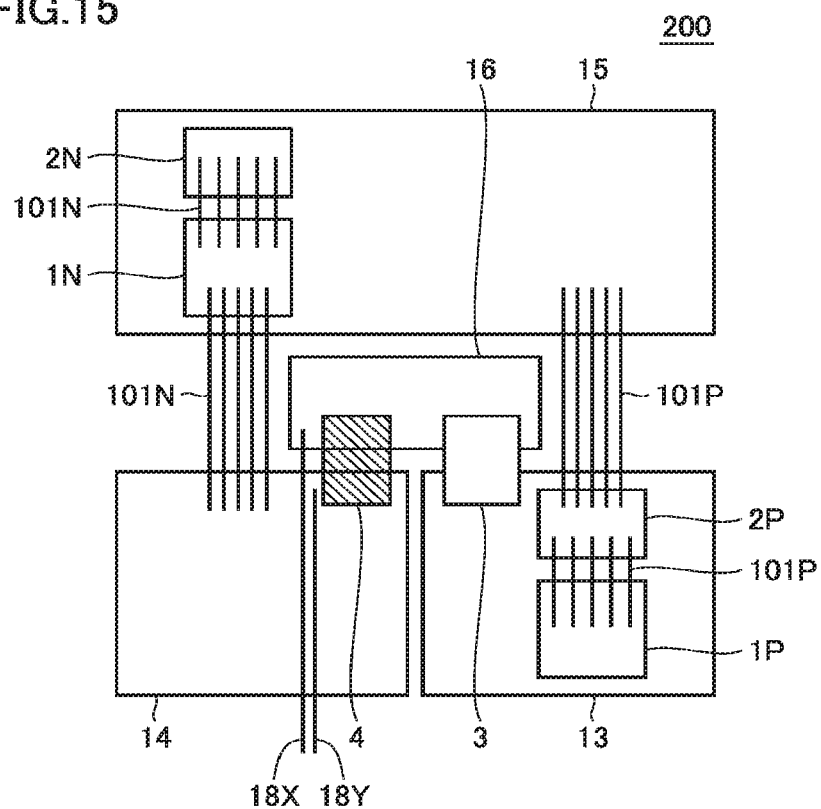
FIG. 15 is a diagram showing an example of the arrangement of the internal configuration of a power semiconductor module 200.

FIG. 15 is a diagram showing an example of the arrangement of the internal configuration of power semiconductor module 200. The arrangement example in the present embodiment in FIG. 15 differs from the arrangement example in the fourth embodiment in FIG. 13 in the following points.

In the arrangement example in the present embodiment shown in FIG. 15, temperature detector 6 is not disposed. Instead, two detection conductors 18X and 18Y are connected to both ends of snubber resistor 4. First detection conductor 18X connects the proximity of one end of snubber resistor 4 on intermediate electrode 16 pattern 16 to the not-shown first control terminal 17X. Second detection conductor 18Y connects the proximity of the other end of snubber resistor 4 on negative electrode conductor pattern 14 to the not-shown second control terminal 17Y. With such a configuration, the voltage across snubber resistor 4 can be detected.

Also in the present modification, the positions of snubber capacitor 3 and snubber resistor 4 may be changed each other. Specifically, snubber resistor 4 may be mounted between positive electrode conductor pattern 13 and intermediate electrode pattern 16, snubber capacitor 3 may be mounted between intermediate electrode pattern 16 and negative electrode conductor pattern 14, first detection conductor 18X may connect the proximity of one end of snubber resistor 4 on positive electrode conductor pattern 13 to the not-shown first control terminal 17X, and second detection conductor 18Y may connect the proximity of the other end of snubber resistor 4 on intermediate electrode pattern 16 to the not-shown second control terminal 17Y.

Modification of Fifth Embodiment

The present modification relates to another example of the arrangement of the internal configuration of power semiconductor module 200 in the first modification of the first embodiment.

Figure 16:
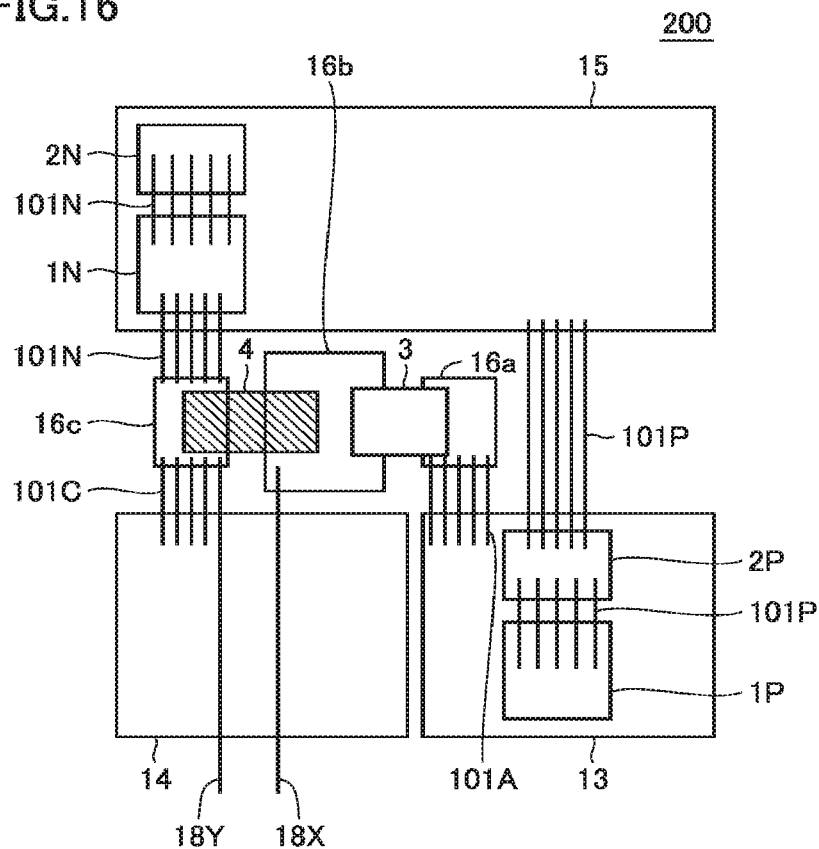
FIG. 16 is a diagram showing another example of the arrangement of the internal configuration of power semiconductor module 200.

FIG. 16 is a diagram showing another example of the arrangement of the internal configuration of power semiconductor module 200. The present modification in FIG. 16 differs from the arrangement example in the modification of the fourth embodiment in FIG. 14 in the following points.

In the arrangement example in the present modification shown in FIG. 16, temperature detector 6 is not arranged. Instead, two detection conductors 18X and 18Y are connected to both ends of snubber resistor 4. First detection conductor 18X connects the proximity of one end of snubber resistor 4 on intermediate electrode pattern 16b to the not-shown first control terminal 17X. Second detection conductor 18Y connects the proximity of the other end of snubber resistor 4 on intermediate electrode pattern 16c to the not-shown second control terminal 17Y. With such a configuration, the voltage across snubber resistor 4 can be detected.

Also in the present modification, the positions of snubber capacitor 3 and snubber resistor 4 may be changed each other. Specifically, snubber resistor 4 may be mounted between intermediate electrode pattern 16a and intermediate electrode pattern 16b, snubber capacitor 3 may be mounted between intermediate electrode pattern 16b and intermediate electrode pattern 16c, first detection conductor 18X may connect the proximity of one end of snubber resistor 4 on intermediate electrode pattern 16a to the not-shown first control terminal 17X, and second detection conductor 18Y may connect the proximity of the other end of snubber resistor 4 on intermediate electrode pattern 16b to the not-shown second control terminal 17Y.

Sixth Embodiment

The present embodiment relates to another example of the arrangement of the internal configuration of power semiconductor module 100 described in the first embodiment.

Figure 17:
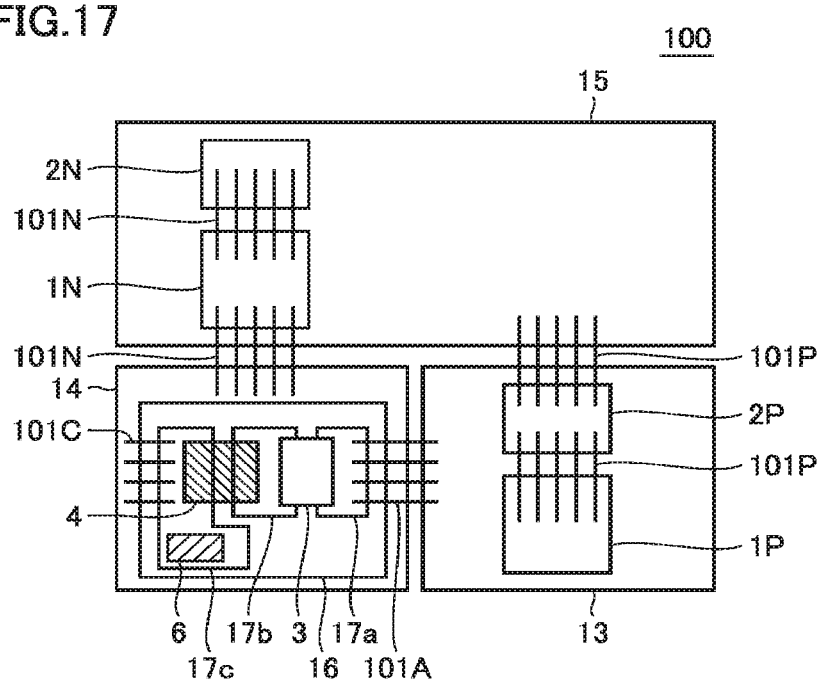
FIG. 17 is a diagram showing another example of the arrangement of the internal configuration of power semiconductor module 100.

FIG. 17 is a diagram showing another example of the arrangement of the internal configuration of power semiconductor module 100.

Power semiconductor device 1P and freewheeling diode 2P are mounted on positive electrode conductor pattern 13. Power semiconductor device 1P and freewheeling diode 2P are connected to output conductor pattern 15 through bonding wire 101P. Power semiconductor device 1N and freewheeling diode 2N are mounted on output conductor pattern 15. Power semiconductor device 1N and freewheeling diode 2N are connected to negative electrode conductor pattern 14 through bonding wire 101N.

Intermediate electrode pattern 16 is mounted on negative electrode conductor pattern 14.

Intermediate electrode pattern 17a, intermediate electrode pattern 17b, and intermediate electrode pattern 17c are mounted on intermediate electrode pattern 16.

Positive electrode conductor pattern 13 and intermediate electrode pattern 17a are connected through bonding wire 101A. Snubber capacitor 3 is mounted between intermediate electrode pattern 17a and intermediate electrode pattern 17b. Snubber resistor 4 is mounted between intermediate electrode pattern 17b and intermediate electrode pattern 17c. Intermediate electrode pattern 17c and negative electrode conductor pattern 14 are connected through bonding wire 101C. With such an arrangement, snubber capacitor 3 and snubber resistor 4 are connected in series between positive electrode conductor pattern 13 and negative electrode conductor pattern 14 through intermediate electrode pattern 17a, intermediate electrode pattern 17b, and intermediate electrode pattern 17c.

Temperature detector 6 is mounted in proximity to snubber resistor 4 on intermediate electrode pattern 17c. With such a configuration, the temperature of snubber resistor 4 can be detected using temperature detector 6. Temperature detector 6 is connected to the not-shown first control terminal 7.

Temperature detector 6 may be mounted in proximity to snubber resistor 4 on intermediate electrode pattern 17b.

Although intermediate electrode pattern 16 is mounted on negative electrode conductor pattern 14 in the embodiment above, the present disclosure is not limited thereto. Intermediate electrode pattern 16 may be mounted on positive electrode conductor pattern 13 or may be mounted on output conductor pattern 15.

Also in the present modification, the positions of snubber capacitor 3 and snubber resistor 4 may be changed each other. Specifically, snubber resistor 4 may be mounted between intermediate electrode pattern 17a and intermediate electrode pattern 17b, snubber capacitor 3 may be mounted between intermediate electrode pattern 17b and intermediate electrode pattern 17c, and temperature detector 6 may be mounted in proximity to snubber resistor 4 on intermediate electrode pattern 17a or intermediate electrode pattern 17b.

Modification of Sixth Embodiment

The present modification relates to another example of the arrangement of the internal configuration of power semiconductor module 100 described in the first embodiment.

Figure 18:
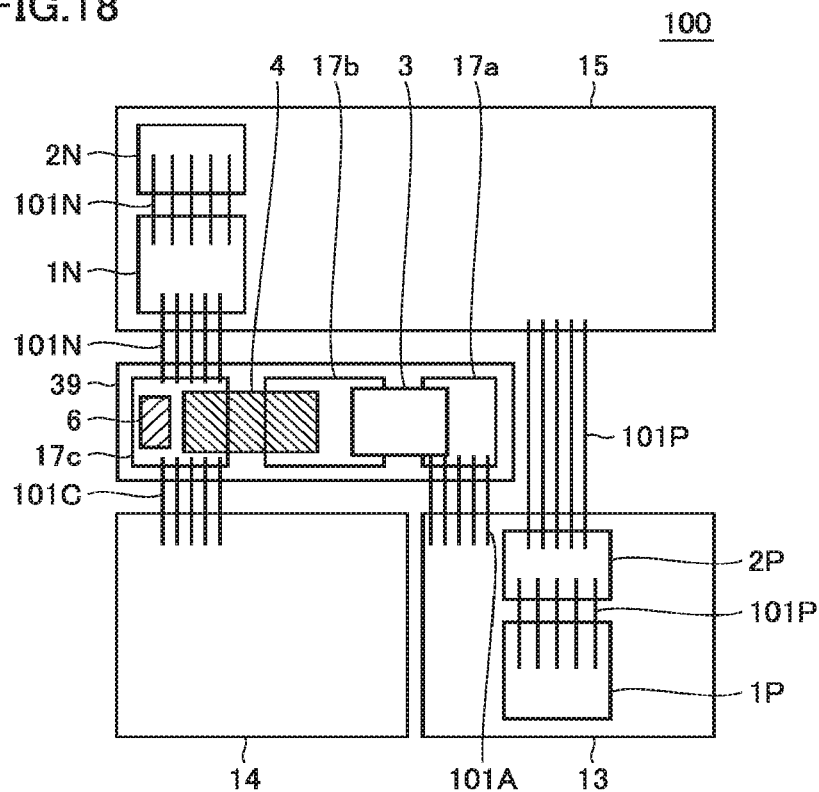
FIG. 18 is a diagram showing another example of the arrangement of the internal configuration of power semiconductor module 100.

FIG. 18 is a diagram showing another example of the arrangement of the internal configuration of power semiconductor module 100.

In the arrangement example in FIG. 17, intermediate electrode patterns 17a, 17b, and 17c are mounted on intermediate electrode pattern 16, whereas in the arrangement example in the present modification, intermediate electrode patterns 17a, 17b, and 17c are not mounted on any of positive electrode conductor pattern 13, negative electrode conductor pattern 14, and output conductor pattern 15.

Power semiconductor device 1P and freewheeling diode 2P are mounted on positive electrode conductor pattern 13. Power semiconductor device 1P and freewheeling diode 2P are connected to output conductor pattern 15 through bonding wire 101P. Power semiconductor device 1N and freewheeling diode 2N are mounted on output conductor pattern 15. Power semiconductor device 1N and freewheeling diode 2N are connected to negative electrode conductor pattern 14 through bonding wires 101N, 101C, and intermediate electrode pattern 17c.

Intermediate electrode pattern 17a, intermediate electrode pattern 17b, and intermediate electrode pattern 17c are mounted on an insulating substrate 39.

Positive electrode conductor pattern 13 and intermediate electrode pattern 17a are connected through bonding wire 101A. Snubber capacitor 3 is mounted between intermediate electrode pattern 17a and intermediate electrode pattern 17b. Snubber resistor 4 is mounted between intermediate electrode pattern 17b and intermediate electrode pattern 17c. Intermediate electrode pattern 17c and negative electrode conductor pattern 14 are connected through bonding wire 101C. With such an arrangement, snubber capacitor 3 and snubber resistor 4 are connected in series between positive electrode conductor pattern 13 and negative electrode conductor pattern 14 through intermediate electrode pattern 17a, intermediate electrode pattern 17b, and intermediate electrode pattern 17c.

Temperature detector 6 is mounted in proximity to snubber resistor 4 on intermediate electrode pattern 17c. With such a configuration, the temperature of snubber resistor 4 can be detected using temperature detector 6. Temperature detector 6 is connected to the not-shown first control terminal 7.

Temperature detector 6 may be mounted in proximity to snubber resistor 4 on intermediate electrode pattern 17b.

Also in the present modification, the positions of snubber capacitor 3 and snubber resistor 4 may be changed each other. Specifically, snubber resistor 4 may be mounted between intermediate electrode pattern 17a and intermediate electrode pattern 17b, snubber capacitor 3 may be mounted between intermediate electrode pattern 17b and intermediate electrode pattern 17c, and temperature detector 6 may be mounted in proximity to snubber resistor 4 on intermediate electrode pattern 17a or intermediate electrode pattern 17b.

Seventh Embodiment

The present embodiment relates to another example of the arrangement of the internal configuration of power semiconductor module 200 described in the first modification of the first embodiment.

Figure 19:
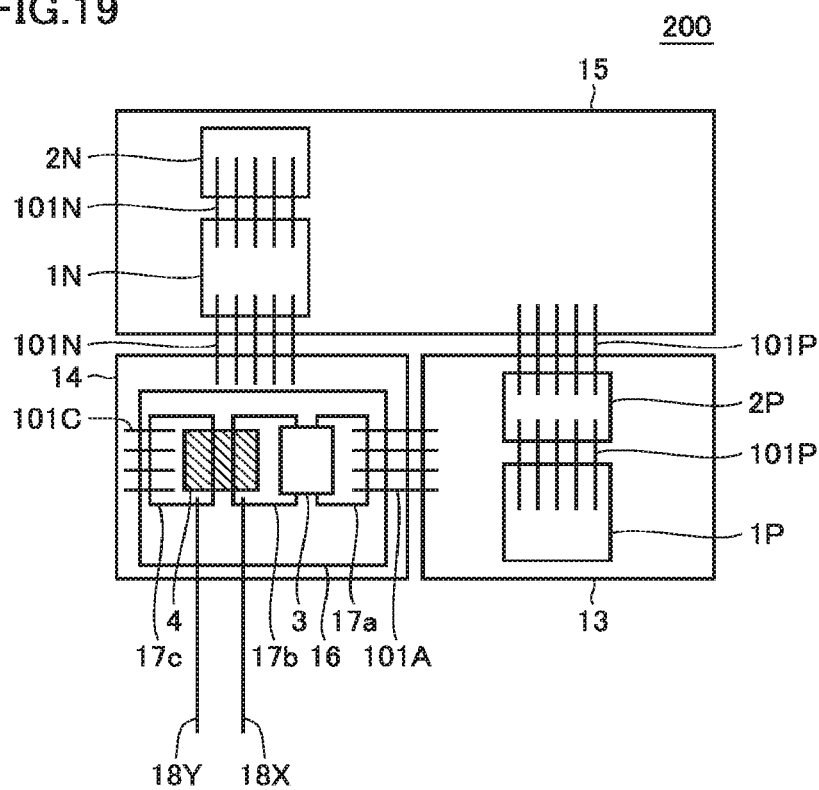
FIG. 19 is a diagram showing an example of the arrangement of the internal configuration of power semiconductor module 200.

FIG. 19 is a diagram showing an example of the arrangement of the internal configuration of power semiconductor module 200. The arrangement example in the present embodiment in FIG. 19 differs from the arrangement example in a sixth embodiment in FIG. 17 in the following points.

In the arrangement example in the present embodiment shown in FIG. 19, temperature detector 6 is not arranged. Instead, two detection conductors 18X and 18Y are connected to both ends of snubber resistor 4. First detection conductor 18X connects the proximity of one end of snubber resistor 4 on intermediate electrode pattern 17b to the not-shown first control terminal 17X. Second detection conductor 18Y connects the proximity of the other end of snubber resistor 4 on intermediate electrode pattern 17c to the not-shown second control terminal 17Y. With such a configuration, the voltage across snubber resistor 4 can be detected.

Although intermediate electrode pattern 16 is mounted on negative electrode conductor pattern 14 in the embodiment above, the present disclosure is not limited thereto. Intermediate electrode pattern 16 may be mounted on positive electrode conductor pattern 13 or may be mounted on output conductor pattern IS.

Also in the present modification, the positions of snubber capacitor 3 and snubber resistor 4 may be changed each other. Specifically, snubber resistor 4 may be mounted between intermediate electrode pattern 17a and intermediate electrode pattern 17b, snubber capacitor 3 may be mounted between intermediate electrode pattern 17b and intermediate electrode pattern 17c, first detection conductor 18X may connect the proximity of one end of snubber resistor 4 on intermediate electrode pattern 17a to the not-shown first control terminal 17X, and second detection conductor 18Y may connect the proximity of the other end of snubber resistor 4 on intermediate electrode pattern 17b to the not-shown second control terminal 17Y.

Modification of Seventh Embodiment

The present modification relates to another example of the arrangement of the internal configuration of power semiconductor module 200 in the first modification of the first embodiment.

Figure 20:
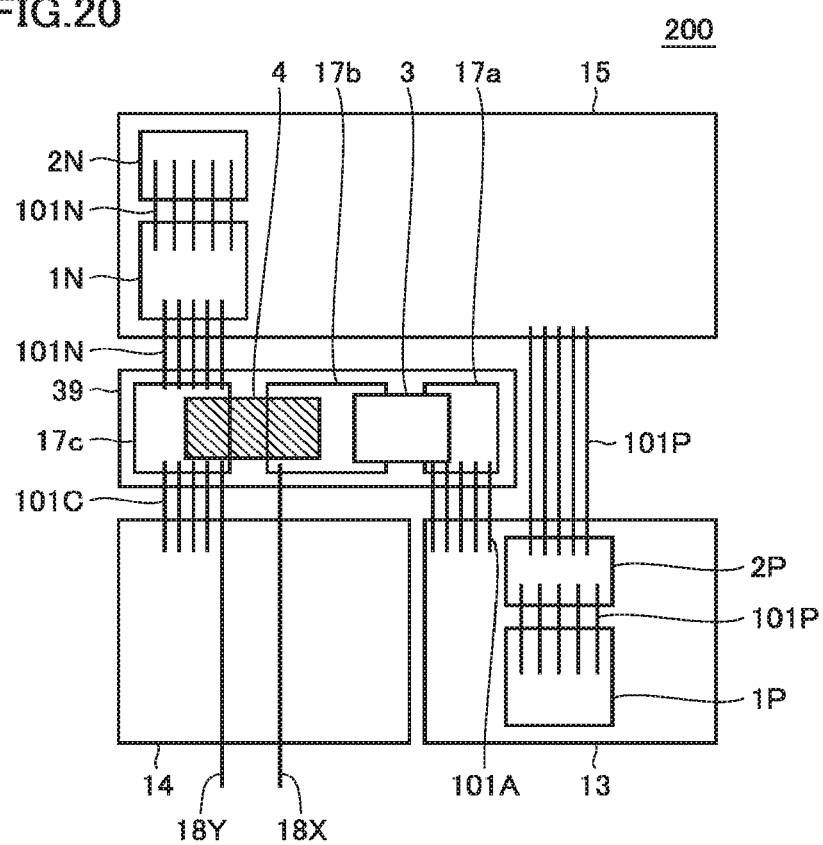
FIG. 20 is a diagram showing another example of the arrangement of the internal configuration of power semiconductor module 200.

FIG. 20 is a diagram showing another example of the arrangement of the internal configuration of power semiconductor module 200. The arrangement example in the present modification in FIG. 20 differs from the arrangement example in the sixth embodiment in FIG. 18 in the following points.

In the arrangement example in the present modification shown in FIG. 20, temperature detector 6 is not arranged. Instead, two detection conductors 18X and 18Y are connected to both ends of snubber resistor 4. First detection conductor 18X connects the proximity of one end of snubber resistor 4 on intermediate electrode pattern 17b to the not-shown first control terminal 17X. Second detection conductor 18Y connects the proximity of the other end of snubber resistor 4 on intermediate electrode pattern 17d to second control terminal 17Y. With such a configuration, the voltage across snubber resistor 4 can be detected.

Also in the present modification, the positions of snubber capacitor 3 and snubber resistor 4 may be changed each other. Specifically, snubber resistor 4 may be mounted between intermediate electrode pattern 17a and intermediate electrode pattern 17b, snubber capacitor 3 may be mounted between intermediate electrode pattern 17b and intermediate electrode pattern 17c, first detection conductor 18X may connect the proximity of one end of snubber resistor 4 on intermediate electrode pattern 17a to the not-shown first control terminal 17X, and second detection conductor 18Y may connect the proximity of the other end of snubber resistor 4 on intermediate electrode pattern 17b to the not-shown second control terminal 17Y.

Eighth Embodiment

The present embodiment relates to an example of the arrangement of the internal configuration of power semiconductor module 300 described in the second modification of the first embodiment.

Figure 21:
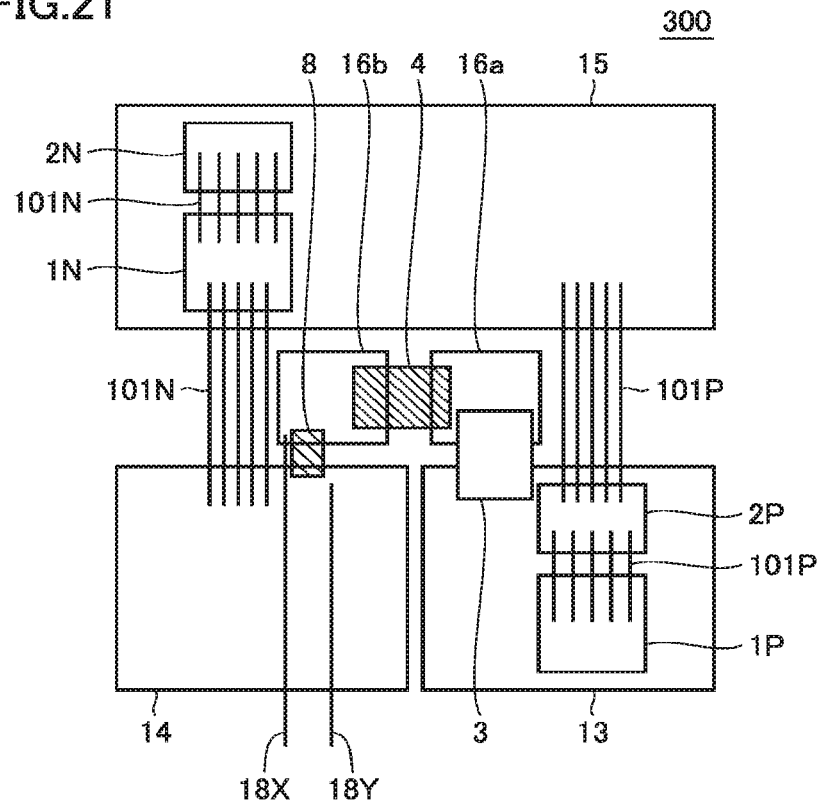
FIG. 21 is a diagram showing an example of the arrangement of the internal configuration of a power semiconductor module 300.

FIG. 21 is a diagram showing an example of the arrangement of the internal configuration of power semiconductor module 300.

Power semiconductor device 1P and freewheeling diode 2P are mounted on positive electrode conductor pattern 13. Power semiconductor device 1P and freewheeling diode 2P are connected to output conductor pattern 15 through bonding wire 101P. Power semiconductor device 1N and freewheeling diode 2N are mounted on output conductor pattern 15. Power semiconductor device 1N and freewheeling diode 2N are connected to negative electrode conductor pattern 14 through bonding wire 101N.

Snubber capacitor 3 is mounted between positive electrode conductor pattern 13 and intermediate electrode pattern 16a. Snubber resistor 4 is mounted between intermediate electrode pattern 16a and intermediate electrode pattern 16b. Shunt resistor 8 is mounted between intermediate electrode pattern 16b and negative electrode conductor pattern 14. With such an arrangement, snubber capacitor 3, snubber resistor 4, and shunt resistor 8 are connected in series between positive electrode conductor pattern 13 and negative electrode conductor pattern 14 through intermediate electrode pattern 16a and intermediate electrode pattern 16b.

Two detection conductors 18X and 18Y are connected to both ends of shunt resistor 8. First detection conductor 18X connects the proximity of one end of shunt resistor 8 on intermediate electrode pattern 16b to the not-shown first control terminal 27X. Second detection conductor 18Y connects the proximity of the other end of shunt resistor 8 on negative electrode conductor pattern 14 to the not-shown second control terminal 27Y. With such a configuration, the voltage across shunt resistor 8 can be detected.

It is noted that another arrangement may be employed as long as shunt resistor 8 is positioned closer to the negative electrode side than snubber capacitor 3 is.

For example, snubber capacitor 3 may be mounted between positive electrode conductor pattern 13 and intermediate electrode pattern 16a, shunt resistor 8 may be mounted between intermediate electrode pattern 16a and intermediate electrode pattern 16b, snubber resistor 4 may be mounted between intermediate electrode pattern 16b and negative electrode conductor pattern 14, first detection conductor 18X may connect the proximity of one end of shunt resistor 8 on intermediate electrode pattern 16a to the not-shown first control terminal 27X, and second detection conductor 18Y may connect the proximity of the other end of shunt resistor 8 on intermediate electrode pattern 16b to the not-shown second control terminal 27Y.

Alternatively, snubber resistor 4 may be mounted between positive electrode conductor pattern 13 and intermediate electrode pattern 16a, snubber capacitor 3 may be mounted between intermediate electrode pattern 16a and intermediate electrode pattern 16b, shunt resistor 8 may be mounted between intermediate electrode pattern 16b and negative electrode conductor pattern 14, first detection conductor 18X may connect the proximity of one end of shunt resistor 8 on intermediate electrode pattern 16b to the not-shown first control terminal 27X, and second detection conductor 18Y may connect the proximity of the other end of shunt resistor 8 on negative electrode conductor pattern 14 to the not-shown second control terminal 27Y.

First Modification of Eighth Embodiment

The present modification relates to another example of the arrangement of the internal configuration of power semiconductor module 300 described in the second modification of the first embodiment.

Figure 22:
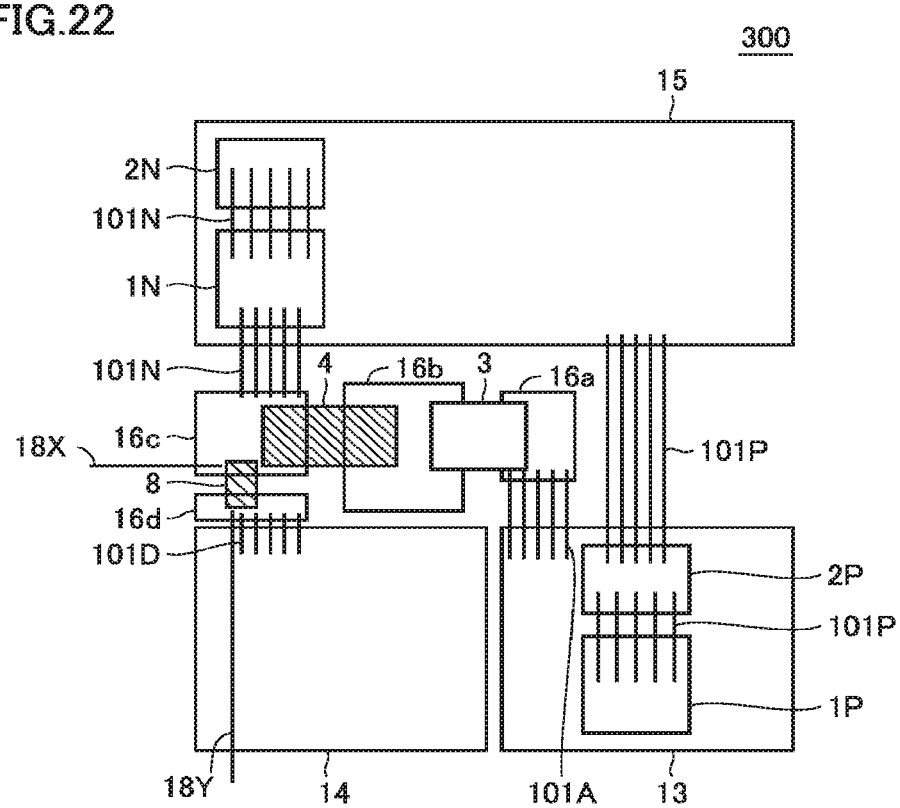
FIG. 22 is a diagram showing another example of the arrangement of the internal configuration of power semiconductor module 300.

FIG. 22 is a diagram showing another example of the arrangement of the internal configuration of power semiconductor module 300.

Power semiconductor device 1P and freewheeling diode 2P are mounted on positive electrode conductor pattern 13. Power semiconductor device 1P and freewheeling diode 2P are connected to output conductor pattern 15 through bonding wire 101P. Power semiconductor device 1N and freewheeling diode 2N are mounted on output conductor pattern 15. Power semiconductor device 1N and freewheeling diode 2N are connected to negative electrode conductor pattern 14 through bonding wires 101N, 101D, intermediate electrode patterns 16c, 16d, and shunt resistor 8.

Positive electrode conductor pattern 13 and intermediate electrode pattern 16a are connected through bonding wire 101A. Snubber capacitor 3 is mounted between intermediate electrode pattern 16a and intermediate electrode pattern 16b. Snubber resistor 4 is mounted between intermediate electrode pattern 16b and intermediate electrode pattern 16c.

Shunt resistor 8 is mounted between intermediate electrode pattern 16c and intermediate electrode pattern 16d. Intermediate electrode pattern 16d and negative electrode conductor pattern 14 are connected through bonding wire 101D. With such an arrangement, snubber capacitor 3, snubber resistor 4, and shunt resistor 8 are connected in series between positive electrode conductor pattern 13 and negative electrode conductor pattern 14 through intermediate electrode pattern 16a, intermediate electrode pattern 16b, intermediate electrode pattern 16c, and intermediate electrode pattern 16d.

Two detection conductors 18X and 18Y are connected to both ends of shunt resistor 8. First detection conductor 18X connects the proximity of one end of shunt resistor 8 on intermediate electrode pattern 16c to the not-shown first control terminal 27X. Second detection conductor 18Y connects the proximity of the other end of shunt resistor 8 on intermediate electrode pattern 16d to the not-shown second control terminal 27Y. With such a configuration, the voltage across shunt resistor 8 can be detected.

It is noted that another arrangement may be employed as long as shunt resistor 8 is positioned closer to the negative electrode side than snubber capacitor 3 is.

For example, snubber capacitor 3 may be mounted between intermediate electrode pattern 16a and intermediate electrode pattern 16b, shunt resistor 8 may be mounted between intermediate electrode pattern 16b and intermediate electrode pattern 16c, snubber resistor 4 may be mounted between intermediate electrode pattern 16c and intermediate electrode pattern 16d, first detection conductor 18X may connect the proximity of one end of shunt resistor 8 on intermediate electrode pattern 16b to the not-shown first control terminal 27X, and second detection conductor 18Y may connect the proximity of the other end of shunt resistor 8 on intermediate electrode pattern 16c to the not-shown second control terminal 27Y.

Alternatively, snubber resistor 4 may be mounted between intermediate electrode pattern 16a and intermediate electrode pattern 16b, snubber capacitor 3 may be mounted between intermediate electrode pattern 16b and intermediate electrode pattern 16c, shunt resistor 8 may be mounted between intermediate electrode pattern 16c and intermediate electrode pattern 16d, first detection conductor 18X may connect the proximity of one end of shunt resistor 8 on intermediate electrode pattern 16c to the not-shown first control terminal 27X, and second detection conductor ISY may connect the proximity of the other end of shunt resistor 8 on intermediate electrode pattern 16d to the not-shown second control terminal 27Y.

Second Modification of Eighth Embodiment

The present modification relates to another example of the arrangement of the internal configuration of power semiconductor module 300 described in the second modification of the first embodiment.

Figure 23:
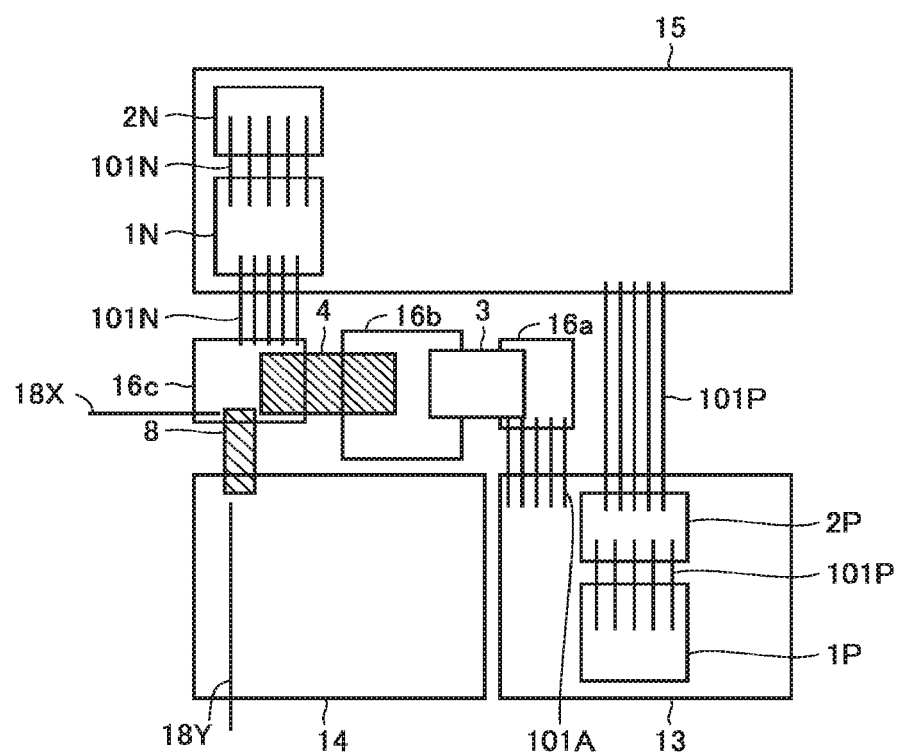
FIG. 23 is a diagram showing another example of the arrangement of the internal configuration of power semiconductor module 300.

FIG. 23 is a diagram showing another example of the arrangement of the internal configuration of power semiconductor module 300.

The arrangement example in FIG. 23 differs from the arrangement example in FIG. 22 in that it does not include intermediate electrode pattern 16d.

In the arrangement example in FIG. 23, snubber capacitor 3 is mounted between intermediate electrode pattern 16a and intermediate electrode pattern 16b. Snubber resistor 4 is mounted between intermediate electrode pattern 16b and intermediate electrode pattern 16c. Shunt resistor 8 is mounted between intermediate electrode pattern 16c and negative electrode conductor pattern 14.

First detection conductor 18X connects the proximity of one end of shunt resistor 8 on intermediate electrode pattern 16c to the not-shown first control terminal 27X. Second detection conductor 18Y connects the proximity of the other end of shunt resistor 8 on negative electrode conductor pattern 14 to the not-shown second control terminal 27Y. With such a configuration, the voltage across shunt resistor 8 can be detected.

It is noted that another arrangement may be employed as long as shunt resistor 8 is positioned closer to the negative electrode side than snubber capacitor 3 is.

For example, snubber capacitor 3 may be mounted between intermediate electrode pattern 16a and intermediate electrode pattern 16b, shunt resistor 8 may be mounted between intermediate electrode pattern 16b and intermediate electrode pattern 16c, snubber resistor 4 may be mounted between intermediate electrode pattern 16c and negative electrode conductor pattern 14, first detection conductor 18X may connect the proximity of one end of shunt resistor 8 on intermediate electrode pattern 16b to the not-shown first control terminal 27X, and second detection conductor 18Y may connect the proximity of the other end of shunt resistor 8 on intermediate electrode pattern 16c to the not-shown second control terminal 27Y.

Alternatively, snubber resistor 4 may be mounted between intermediate electrode pattern 16a and intermediate electrode pattern 16b, snubber capacitor 3 may be mounted between intermediate electrode pattern 16b and intermediate electrode pattern 16c, shunt resistor 8 may be mounted between intermediate electrode pattern 16c and negative electrode conductor pattern 14, first detection conductor 18X may connect the proximity of one end of shunt resistor 8 on intermediate electrode pattern 16c to the not-shown first control terminal 27X, and second detection conductor 18Y may connect the proximity of the other end of shunt resistor 8 on negative electrode conductor pattern 14 to the not-shown second control terminal 27Y.

Ninth Embodiment

The present embodiment relates to another example of the arrangement of the internal configuration of power semiconductor module 300 described in the second modification of the first embodiment.

Figure 24:
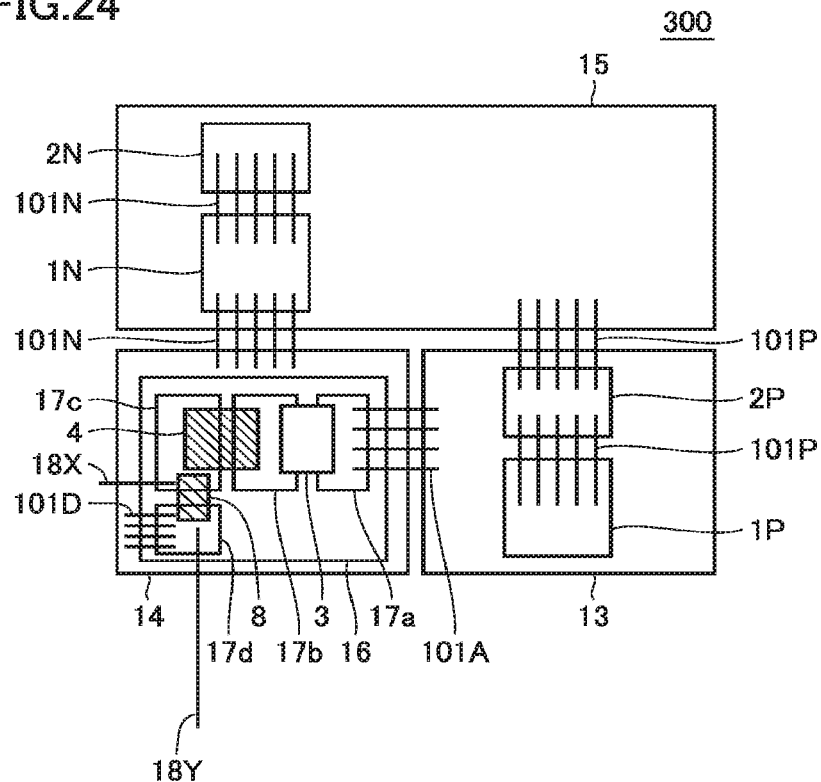
FIG. 24 is a diagram showing another example of the arrangement of the internal configuration of power semiconductor module 300.

FIG. 24 is a diagram showing another example of the arrangement of the internal configuration of power semiconductor module 300.

Power semiconductor device 1P and freewheeling diode 2P are mounted on positive electrode conductor pattern 13. Power semiconductor device 1P and freewheeling diode 2P are connected to output conductor pattern 15 through bonding wire 101P. Power semiconductor device 1N and freewheeling diode 2N are mounted on output conductor pattern 15. Power semiconductor device 1N and freewheeling diode 2N are connected to negative electrode conductor pattern 14 through bonding wire 101N.

Intermediate electrode pattern 16 is mounted on negative electrode conductor pattern 14.

Intermediate electrode pattern 17a, intermediate electrode pattern 17b, intermediate electrode pattern 17c, and intermediate electrode pattern 17d are mounted on intermediate electrode pattern 16.

Positive electrode conductor pattern 13 and intermediate electrode pattern 17a are connected through bonding wire 101A. Snubber capacitor 3 is mounted between intermediate electrode pattern 17a and intermediate electrode pattern 17b. Snubber resistor 4 is mounted between intermediate electrode pattern 17b and intermediate electrode pattern 17c. Shunt resistor 8 is mounted between intermediate electrode pattern 17c and intermediate electrode pattern 17d. Intermediate electrode pattern 17d and negative electrode conductor pattern 14 are connected through bonding wire 101D. With such an arrangement, snubber capacitor 3, snubber resistor 4, and shunt resistor 8 are connected in series between positive electrode conductor pattern 13 and negative electrode conductor pattern 14 through intermediate electrode pattern 17a, intermediate electrode pattern 17b, intermediate electrode pattern 17c, and intermediate electrode pattern 17d.

Two detection conductors 18X and 18Y are connected to both ends of shunt resistor 8. First detection conductor 18X connects the proximity of one end of shunt resistor 8 on intermediate electrode pattern 17c to the not-shown first control terminal 27X. Second detection conductor 18Y connects the proximity of the other end of shunt resistor 8 on intermediate electrode pattern 17d to the not-shown second control terminal 27Y. With such a configuration, the voltage across shunt resistor 8 can be detected.

Although an example in which intermediate electrode pattern 16 is mounted on negative electrode conductor pattern 14 is illustrated, intermediate electrode pattern 16 may be mounted on positive electrode conductor pattern 13 or may be mounted on output conductor pattern 15.

It is noted that another arrangement may be employed as long as shunt resistor 8 is positioned closer to the negative electrode side than snubber capacitor 3 is.

For example, snubber capacitor 3 may be mounted between intermediate electrode pattern 17a and intermediate electrode pattern 17b, shunt resistor 8 may be mounted between intermediate electrode pattern 17b and intermediate electrode pattern 17c, snubber resistor 4 may be mounted between intermediate electrode pattern 17c and intermediate electrode pattern 17d, first detection conductor 18X may connect the proximity of one end of shunt resistor 8 on intermediate electrode pattern 17b to the not-shown first control terminal 27X, and second detection conductor 18Y may connect the proximity of the other end of shunt resistor 8 on intermediate electrode pattern 17c to the not-shown second control terminal 27Y.

Alternatively, snubber resistor 4 may be mounted between intermediate electrode pattern 17a and intermediate electrode pattern 17b, snubber capacitor 3 may be mounted between intermediate electrode pattern 17b and intermediate electrode pattern 17c, shunt resistor 8 may be mounted between intermediate electrode pattern 17c and intermediate electrode pattern 17d, first detection conductor 18X may connect the proximity of one end of shunt resistor 8 on intermediate electrode pattern 17c to the not-shown first control terminal 27X, and second detection conductor 18Y may connect the proximity of the other end of shunt resistor 8 on intermediate electrode pattern 17d to the not-shown second control terminal 27Y.

Modification of Ninth Embodiment

The present modification relates to another example of the arrangement of the internal configuration of power semiconductor module 300 described in the second modification of the first embodiment.

Figure 25:
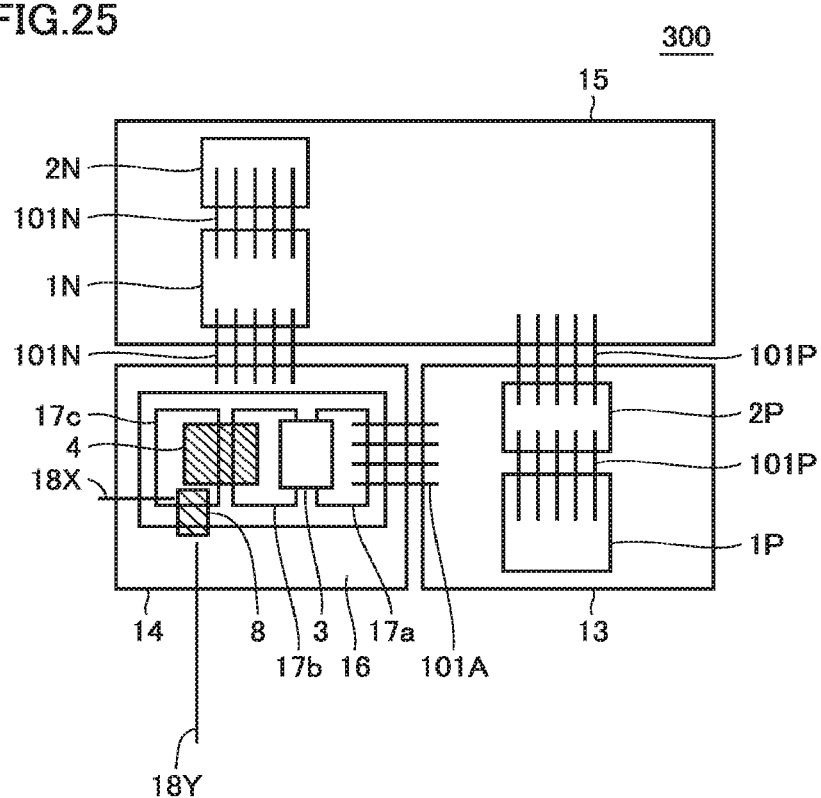
FIG. 25 is a diagram showing another example of the arrangement of the internal configuration of power semiconductor module 300.

FIG. 25 is a diagram showing another example of the arrangement of the internal configuration of power semiconductor module 300.

The arrangement example in FIG. 25 differs from the arrangement example in FIG. 24 in that it does not include intermediate electrode pattern 17d.

In the arrangement example in FIG. 23, snubber capacitor 3 is mounted between intermediate electrode pattern 17a and intermediate electrode pattern 17b. Snubber resistor 4 is mounted between intermediate electrode pattern 17b and intermediate electrode pattern 17c. Shunt resistor 8 is mounted between intermediate electrode pattern 17c and negative electrode conductor pattern 14.

First detection conductor 18X connects the proximity of one end of shunt resistor 8 on intermediate electrode pattern 17c to the not-shown first control terminal 27X. Second detection conductor 18Y connects the proximity of the other end of shunt resistor 8 on negative electrode conductor pattern 14 to the not-shown second control terminal 27Y. With such a configuration, the voltage across shunt resistor 8 can be detected.

It is noted that another arrangement may be employed as long as shunt resistor 8 is positioned closer to the negative electrode side than snubber capacitor 3 is.

For example, snubber capacitor 3 may be mounted between intermediate electrode pattern 17a and intermediate electrode pattern 7b, shunt resistor 8 may be mounted between intermediate electrode pattern 17b and intermediate electrode pattern 17c, snubber resistor 4 may be mounted between intermediate electrode pattern 17c and negative electrode conductor pattern 14, first detection conductor 18X may connect the proximity of one end of shunt resistor 8 on intermediate electrode pattern 17b to the not-shown first control terminal 27X, and second detection conductor 18Y may connect the proximity of the other end of shunt resistor 8 on intermediate electrode pattern 17c to the not-shown second control terminal 27Y.

Alternatively, snubber resistor 4 may be mounted between intermediate electrode pattern 17a and intermediate electrode pattern 17b, snubber capacitor 3 may be mounted between intermediate electrode pattern 17b and intermediate electrode pattern 17c, shunt resistor 8 may be mounted between intermediate electrode pattern 17c and negative electrode conductor pattern 14, first detection conductor 18X may connect the proximity of one end of shunt resistor 8 on intermediate electrode pattern 17c to the not-shown first control terminal 27X, and second detection conductor 18Y may connect the proximity of the other end of shunt resistor 8 on negative electrode conductor pattern 14 to the not-shown second control terminal 27Y.

Tenth Embodiment

The present modification relates to another example of the arrangement of the internal configuration of power semiconductor module 300 described in the second modification of the first embodiment.

Figure 26:
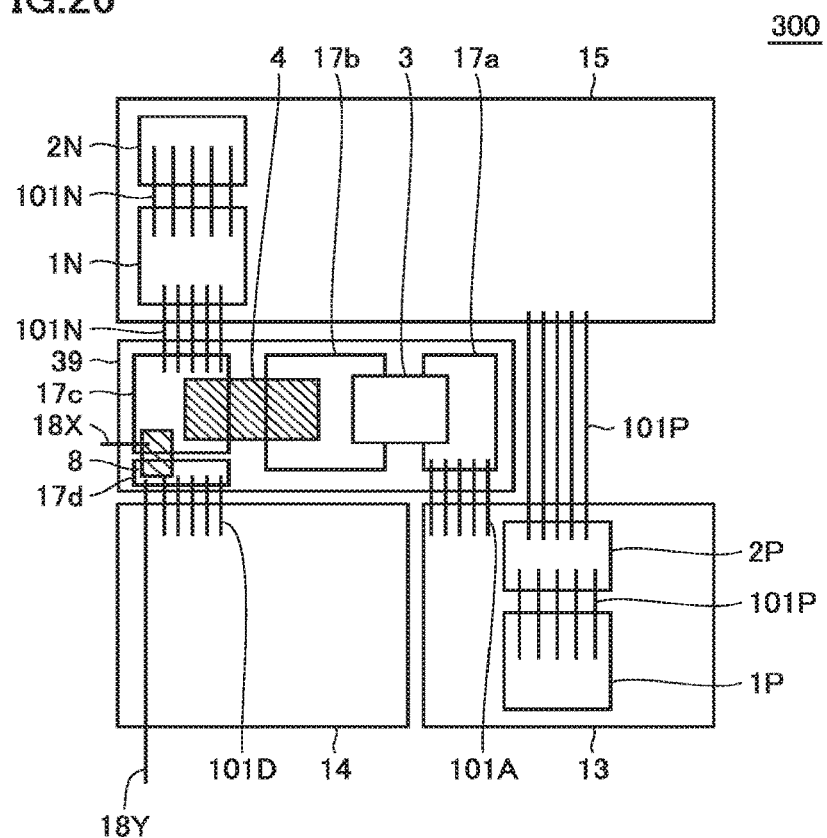
FIG. 26 is a diagram showing another example of the arrangement of the internal configuration of power semiconductor module 300.

FIG. 26 is a diagram showing another example of the arrangement of the internal configuration of power semiconductor module 300.

Power semiconductor device 1P and freewheeling diode 2P are mounted on positive electrode conductor pattern 13. Power semiconductor device 1P and freewheeling diode 2P are connected to output conductor pattern 15 through bonding wire 101P. Power semiconductor device 1N and freewheeling diode 2N are mounted on output conductor pattern 15. Power semiconductor device 1N and freewheeling diode 2N are connected to negative electrode conductor pattern 14 through bonding wires 101N, 101D, intermediate electrode patterns 17c, 17d, and shunt resistor 8.

Intermediate electrode pattern 17a, intermediate electrode pattern 17b, intermediate electrode pattern 17c, and intermediate electrode pattern 17d are mounted on an insulating substrate 39.

Positive electrode conductor pattern 13 and intermediate electrode pattern 17a are connected through bonding wire 101A. Snubber capacitor 3 is mounted between intermediate electrode pattern 17a and intermediate electrode pattern 17b. Snubber resistor 4 is mounted between intermediate electrode pattern 17b and intermediate electrode pattern 17c. Shunt resistor 8 is mounted between intermediate electrode pattern 17c and intermediate electrode pattern 17d. Intermediate electrode pattern 17d and negative electrode conductor pattern 14 are connected through bonding wire 101D. With such an arrangement, snubber capacitor 3, snubber resistor 4, and shunt resistor 8 are connected in series between positive electrode conductor pattern 13 and negative electrode conductor pattern 14 through intermediate electrode pattern 17a, intermediate electrode pattern 17b, intermediate electrode pattern 17c, and intermediate electrode pattern 17d.

Two detection conductors 18X and 18Y are connected to both ends of shunt resistor 8. First detection conductor 18X connects the proximity of one end of shunt resistor 8 on intermediate electrode pattern 17c to the not-shown first control terminal 27X.

Second detection conductor 18Y connects the proximity of the other end of shunt resistor 8 on intermediate electrode pattern 17d to the not-shown second control terminal 27Y. With such a configuration, the voltage across shunt resistor 8 can be detected.

It is noted that another arrangement may be employed as long as shunt resistor 8 is positioned closer to the negative electrode side than snubber capacitor 3 is.

For example, snubber capacitor 3 may be mounted between intermediate electrode pattern 17a and intermediate electrode pattern 17b, shunt resistor 8 may be mounted between intermediate electrode pattern 17b and intermediate electrode pattern 17c, snubber resistor 4 may be mounted between intermediate electrode pattern 17c and intermediate electrode pattern 17d, first detection conductor 18X may connect the proximity of one end of shunt resistor 8 on intermediate electrode pattern 17b to the not-shown first control terminal 27X, and second detection conductor 18Y may connect the proximity of the other end of shunt resistor 8 on intermediate electrode pattern 17c to the not-shown second control terminal 27Y.

Alternatively, snubber resistor 4 may be mounted between intermediate electrode pattern 17a and intermediate electrode pattern 17b, snubber capacitor 3 may be mounted between intermediate electrode pattern 17b and intermediate electrode pattern 17c, shunt resistor 8 may be mounted between intermediate electrode pattern 17c and intermediate electrode pattern 17d, first detection conductor 18X may connect the proximity of one end of shunt resistor 8 on intermediate electrode pattern 17c to the not-shown first control terminal 27X, and second detection conductor 18Y may connect the proximity of the other end of shunt resistor 8 on intermediate electrode pattern 174 to the not-shown second control terminal 27Y.

Modification of Tenth Embodiment

The present modification relates to another example of the arrangement of the internal configuration of power semiconductor module 300 described in the second modification of the first embodiment.

Figure 27:
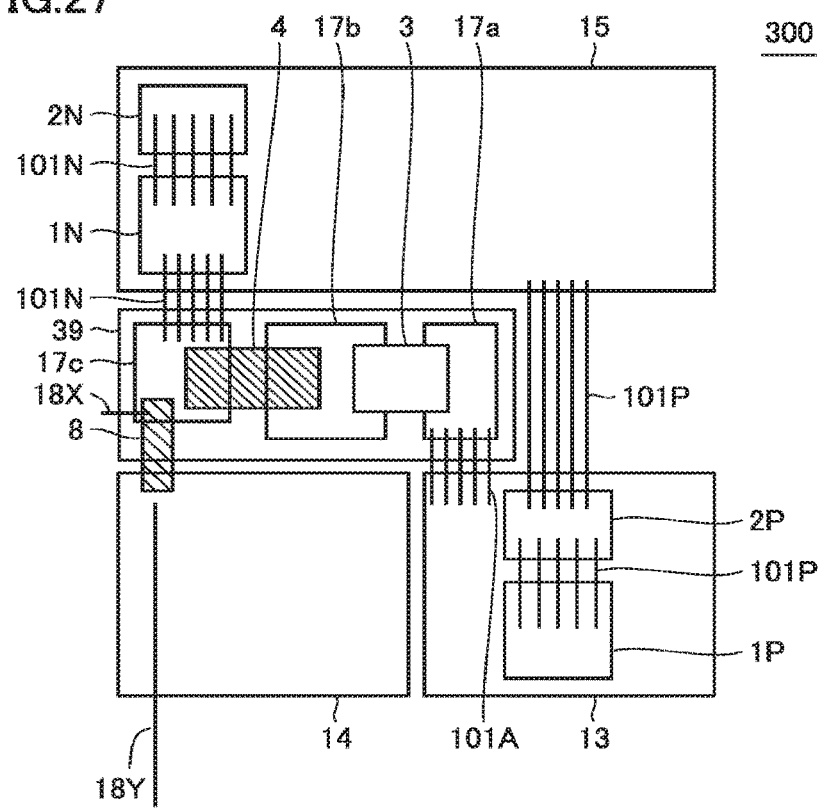
FIG. 27 is a diagram showing another example of the arrangement of the internal configuration of power semiconductor module 300.

FIG. 27 is a diagram showing another example of the arrangement of the internal configuration of power semiconductor module 300.

The arrangement example in FIG. 27 differs from the arrangement example in FIG. 26 in that it does not include intermediate electrode pattern 17d.

In the arrangement example in FIG. 27, snubber capacitor 3 is mounted between intermediate electrode pattern 17a and intermediate electrode pattern 17b. Snubber resistor 4 is mounted between intermediate electrode pattern 17b and intermediate electrode pattern 17c. Shunt resistor 8 is mounted between intermediate electrode pattern 17c and negative electrode conductor pattern 14.

First detection conductor 18X connects the proximity of one end of shunt resistor 8 on intermediate electrode pattern 17c to the not-shown first control terminal 27X. Second detection conductor 18Y connects the proximity of the other end of shunt resistor 8 on negative electrode conductor pattern 14 to the not-shown second control terminal 27Y. With such a configuration, the voltage across shunt resistor 8 can be detected.

It is noted that another arrangement may be employed as long as shunt resistor 8 is positioned closer to the negative electrode side than snubber capacitor 3 is.

For example, snubber capacitor 3 may be mounted between intermediate electrode pattern 17a and intermediate electrode pattern 17b, shunt resistor 8 may be mounted between intermediate electrode pattern 17b and intermediate electrode pattern 17c, snubber resistor 4 may be mounted between intermediate electrode pattern 17c and negative electrode conductor pattern 14, first detection conductor 18X may connect the proximity of one end of shunt resistor 8 on intermediate electrode pattern 17b to the not-shown first control terminal 27X, and second detection conductor 18Y may connect the proximity of the other end of shunt resistor 8 on intermediate electrode pattern 17c to the not-shown second control terminal 27Y.

Alternatively, snubber resistor 4 may be mounted between intermediate electrode pattern 17a and intermediate electrode pattern 17b, snubber capacitor 3 may be mounted between intermediate electrode pattern 17b and intermediate electrode pattern 17c, shunt resistor 8 may be mounted between intermediate electrode pattern 17c and negative electrode conductor pattern 14, first detection conductor 18X may connect the proximity of one end of shunt resistor 8 on intermediate electrode pattern 17c to the not-shown first control terminal 27X, and second detection conductor 18Y may connect the proximity of the other end of shunt resistor 8 on negative electrode conductor pattern 14 to the not-shown second control terminal 27Y.

Eleventh Embodiment

The present embodiment relates to another example of the position of control terminal 7 in the power semiconductor module described in the second embodiment.

Figure 28:
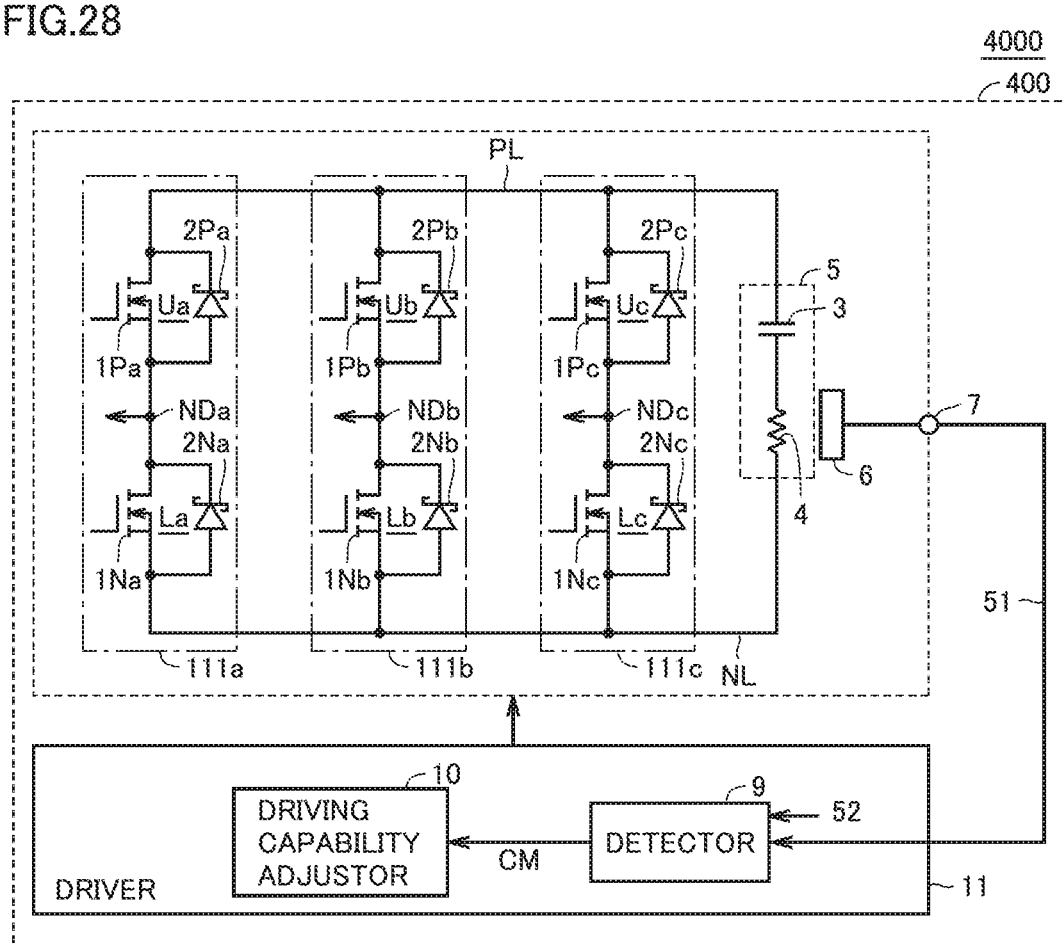
FIG. 28 is a diagram illustrating a circuit configuration of a power semiconductor module 400.

FIG. 28 is a diagram illustrating a circuit configuration of a power semiconductor module 400. In the second embodiment, as shown in FIG. 4, driver 11 is positioned on the outside of power semiconductor module 100. In power conversion apparatus 4000 in an eleventh embodiment, driver 11 is positioned in the inside of power semiconductor module 400. Temperature detector 6 detects the temperature of snubber resistor 4, and a voltage representing the detected temperature is output to driver 11 positioned in the inside of power semiconductor module 400 through first control terminal 7.

According to the present embodiment, the temperature of snubber resistor 4 is output to driver 11 in the inside of power semiconductor module 400 through first control terminal 7, and power semiconductor device 1 can be controlled such that ringing occurred by switching operation is reduced in accordance with the temperature of the snubber resistor.

Similarly, it is needless to say that control terminals 17X, 17Y, 27X, and 27Y described in the third to tenth embodiments may also be the control terminals to be connected to driver 11 in the inside of power semiconductor module 400.

The embodiments disclosed hem should be understood as being illustrative in all respects and should not be construed as being limitative. The scope of the present disclosure is shown not in the foregoing description but in the claims, and it is intended that all modifications that come within the meaning and range of equivalence to the claims are embraced here.

REFERENCE SIGNS LIST 1, 1Pa, 1Na, 1Pb, 1Nb, 1Pc, 1Nc power semiconductor device, 2, 2Pa, 2Na, 2Pb, 2Nb, 2Pc, 2Nc freewheeling diode, 3 snubber capacitor, 4 snubber resistor, 5 snubber circuit, 6 temperature detector, 7, 17X, 17Y, 27X, 27Y control terminal, 8 shunt resistor, 9, 19 detector, 10 driving capability adjustor, 11, 81, 83, 91 driver, 13 positive electrode conductor pattern, 14 negative electrode conductor pattern, 15 output conductor pattern, 16, 16a, 16b, 16c, 16d, 17a, 17b, 17c, 17d intermediate electrode pattern, 18X, 18Y detection conductor, 39 insulating substrate, 51 output from temperature detector 6, 52 reference voltage, 53 comparator, 54p npn transistor, 54n pnp transistor, 55p first on-gate resistor, 55n first off-gate resistor, 56p P-channel MOSFET, 56n N-channel MOSFET, 57p second on-gate resistor, 57n second off-gate resistor, 58p turn-on speed controller, 58n turn-off speed controller, 62 differential amplifier circuit, 70 switching frequency adjustor, 82 controller, 100, 200, 300, 400 power semiconductor module, 101P, 101A, 101C, 101D, 101N bonding wire, 111a, 111b, 111c leg, 1000, 1010, 1020, 2000, 2010, 2020, 3000, 3010, 3020, 4000 power conversion apparatus, Ua, Ub, Uc upper arm, La, Lb, Lc lower arm.

The invention claimed is:

1. A power semiconductor module comprising:
at least one upper arm between a positive electrode line and an output node and including a power semiconductor device and a freewheeling diode connected in antiparallel;
at least one lower arm between a negative electrode line and the output node and including a power semiconductor device and a freewheeling diode connected in antiparallel;
a snubber circuit between the positive electrode line and the negative electrode line, the snubber circuit including a snubber capacitor and a snubber resistor connected in series;
a temperature detector inside of the power semiconductor module and adjacent to the snubber resistor to detect a temperature of the snubber resistor; and
at least one control terminal to output a voltage representing temperature of the snubber resistor or a voltage related to temperature of the snubber resistor to a driver that drives the power semiconductor device, the at least one control terminal including a first control terminal to output the voltage representing the temperature detected by the temperature detector,
wherein the output node is different from the at least one control terminal.

2. A power conversion apparatus comprising:
the power semiconductor module of claim 1;
a comparator to compare the voltage representing temperature with a reference voltage; and
a driving capability adjustor to change at least one of a magnitude of an on-gate resistor at a time of turn-on of the power semiconductor device and a magnitude of an off-gate resistor at a time of turn-off of the power semiconductor device, in accordance with an output signal of the comparator.

3. A power conversion apparatus comprising:
the power semiconductor module of claim 1;
a comparator to compare the voltage representing temperature with a reference voltage; and
a switching frequency adjustor to change a number of times of switching operations per unit time of the power semiconductor device, in accordance with an output signal of the comparator.

4. The power semiconductor module according to claim 1, comprising:
a positive electrode conductor pattern on which the at least one upper arm is mounted;
an output conductor pattern on which the at least one lower arm is mounted;
a negative electrode conductor pattern; and
an intermediate electrode pattern, wherein
the at least one upper arm is connected to the output conductor pattern,
the at least one lower arm is connected to the negative electrode conductor pattern,
one of the snubber capacitor and the snubber resistor is mounted between the positive electrode conductor pattern and the intermediate electrode pattern,
the other of the snubber capacitor and the snubber resistor is mounted between the intermediate electrode pattern and the negative electrode conductor pattern, and
the temperature detector is mounted in proximity to the snubber resistor on the intermediate electrode pattern.

5. The power semiconductor module according to claim 1, comprising:
a positive electrode conductor pattern on which the at least one upper arm is mounted;
an output conductor pattern on which the at least one lower arm is mounted;
a negative electrode conductor pattern;
a first intermediate electrode pattern;
a second intermediate electrode pattern; and
a third intermediate electrode pattern, wherein
the at least one upper arm is connected to the output conductor pattern,
the at least one lower arm is connected to the negative electrode conductor pattern,
the positive electrode conductor pattern and the first relay electrode pattern are connected,
one of the snubber capacitor and the snubber resistor is mounted between the first intermediate relay electrode pattern and the second relay electrode pattern,
the other of the snubber capacitor and the snubber resistor is mounted between the second intermediate relay electrode pattern and the third intermediate relay electrode pattern,
the third intermediate relay electrode pattern and the negative electrode conductor pattern are connected, and
the temperature detector is mounted in proximity to the snubber resistor on the first intermediate electrode pattern, the second intermediate electrode pattern, or the third intermediate electrode pattern.

6. The power semiconductor module according to claim 1 comprising:
a positive electrode conductor pattern on which the at least one upper arm is mounted;
an output conductor pattern on which the at least one lower arm is mounted;
a negative electrode conductor pattern;
a first intermediate electrode pattern;
a second intermediate electrode pattern;
a third intermediate electrode pattern; and
a fourth intermediate electrode pattern on which the first intermediate electrode pattern, the second intermediate electrode pattern, and the third intermediate electrode pattern are mounted, wherein
the at least one upper arm is connected to the output conductor pattern,
the at least one lower arm is connected to the negative electrode conductor pattern,
the positive electrode conductor pattern and the first relay electrode pattern are connected,
one of the snubber capacitor and the snubber resistor is mounted between the first intermediate relay electrode pattern and the second intermediate relay electrode pattern,
the other of the snubber capacitor and the snubber resistor is mounted between the second intermediate relay electrode pattern and the third intermediate relay electrode pattern,
the third intermediate refer electrode pattern and the negative electrode conductor pattern are connected,
the fourth intermediate electrode pattern is mounted on any of the positive electrode conductor pattern, the negative electrode conductor pattern, and the output conductor pattern, and
the temperature detector is mounted in proximity to the snubber resistor on the first intermediate electrode pattern, the second intermediate electrode pattern, or the third intermediate electrode pattern.

7. The power semiconductor module according to claim 1, comprising:
a positive electrode conductor pattern on which the at least one upper arm is mounted;
an output conductor pattern on which the at least one lower arm is mounted;
a negative electrode conductor pattern;
a first intermediate electrode pattern;
a second intermediate electrode pattern;
a third intermediate electrode pattern; and
an insulating substrate on which the first intermediate electrode pattern, the second intermediate electrode pattern, and the third intermediate electrode pattern are mounted, wherein
the at least one upper arm is connected to the output conductor pattern,
the at least one lower arm is connected to the negative electrode conductor pattern,
the positive electrode conductor pattern and the first intermediate electrode pattern are connected,
one of the snubber capacitor and the snubber resistor is mounted between the first intermediate relay electrode pattern and the second intermediate relay electrode pattern,
the other of the snubber capacitor and the snubber resistor is mounted between the second intermediate electrode pattern and the third intermediate electrode pattern, the third intermediate electrode pattern and the negative electrode conductor pattern are connected, and
the temperature detector is mounted in proximity to the snubber resistor on the first intermediate electrode pattern, the second intermediate relay electrode pattern, or the third intermediate electrode pattern.

8. The power semiconductor module according to claim 1, wherein the snubber capacitor of the snubber circuit is directly connected to the positive electrode line, and/or wherein the snubber resistor of the snubber circuit is directly connected to the negative electrode line.

9. The power semiconductor module according to claim 1, wherein the at least one upper arm includes a plurality of upper arms each between the positive electrode line and the output node and including the power semiconductor device and the freewheeling diode connected in antiparallel,
wherein the at least one lower arm includes a plurality of lower arms each between the negative electrode line and the output node and including the power semiconductor device and the freewheeling diode connected in antiparallel, and
wherein the snubber resistor is the only snubber resistor of the power semiconductor module.

10. A power semiconductor module comprising:
at least one upper arm between a positive electrode line and an output node and including a power semiconductor device and a freewheeling diode connected in antiparallel;
at least one lower arm between a negative electrode line and the output node and including a power semiconductor device and a freewheeling diode connected in antiparallel;
a snubber circuit connected directly to the positive electrode line and the negative electrode line, the snubber circuit including a snubber capacitor and a snubber resistor connected in series; and
a first control terminal and a second control terminal to output a voltage across the snubber resistor to a driver external to the power semiconductor module,
wherein the output node is different from the first control terminal and the second control terminal.

11. A power conversion apparatus comprising:
the power semiconductor module of claim 10;
a differential amplifier circuit to differentially amplify a voltage across the snubber resistor;
a comparator to compare the differentially-amplified voltage with a reference voltage; and
a driving capability adjustor to change at least one of a magnitude of an on-gate resistor at a time of turn-on of the power semiconductor device and a magnitude of an off-gate resistor at a time of turn-off of the power semiconductor device, in accordance with an output signal of the comparator.

12. A power conversion apparatus comprising:
the power semiconductor module of claim 10,
a differential amplifier circuit to differentially amplify a voltage across the snubber resistor;
a comparator to compare the differentially-amplified voltage with a reference voltage; and
a switching frequency adjustor to change a number of times of switching operations per unit time of the power semiconductor device, in accordance with an output signal of the comparator.

13. The power semiconductor module according to claim 10,
wherein the snubber capacitor of the snubber circuit is directly connected to the positive electrode line, and/or
wherein the snubber resistor of the snubber circuit is directly connected to the negative electrode line.

14. The power semiconductor module according to claim 10,
wherein the at least one upper arm includes a plurality of upper arms each between the positive electrode line and the output node and including the power semiconductor device and the freewheeling diode connected in antiparallel,
wherein the at least one lower arm includes a plurality of lower arms each between the negative electrode line and the output node and including the power semiconductor device and the freewheeling diode connected in antiparallel, and
wherein the snubber resistor is the only snubber resistor of the power semiconductor module.

15. A power semiconductor module comprising:
at least one upper arm between a positive electrode line and an output node and including a power semiconductor device and a freewheeling diode connected in antiparallel;
at least one lower arm between a negative electrode line and the output node and including a power semiconductor device and a freewheeling diode connected in antiparallel;
a snubber circuit between the positive electrode line and the negative electrode line, the snubber circuit including a snubber capacitor and a snubber resistor connected in series;
a shunt resistor connected in series with the snubber circuit, between the positive electrode line and the negative electrode line; and
a first control terminal and a second control terminal to output a voltage across the shunt resistor,
wherein the output node is different from the first control terminal and the second control terminal.

16. A power conversion apparatus comprising:
the power semiconductor module of claim 15;
a differential amplifier circuit to differentially amplify a voltage across the snubber resistor;
a comparator to compare the differentially-amplified voltage with a reference voltage; and
a driving capability adjustor to change at least one of the magnitude of an on-gate resistor at a time of turn-on of the power semiconductor device and a magnitude of an off-gate resistor at a time of turn-off of the power semiconductor device, in accordance with an output signal of the comparator.

17. A power conversion apparatus comprising:
the power semiconductor module of claim 15;
a differential amplifier circuit to differentially amplify a voltage across the snubber resistor;
a comparator to compare the differentially-amplified voltage with a reference voltage; and
a switching frequency adjustor to change a number of times of switching operations per unit time of the power semiconductor device, in accordance with an output signal of the comparator.

18. The power semiconductor module according to claim 15,
wherein the snubber capacitor of the snubber circuit is directly connected to the positive electrode line, and/or
wherein the snubber resistor of the snubber circuit is directly connected to the negative electrode line.

19. The power semiconductor module according to claim 15,
wherein the at least one upper arm includes a plurality of upper arms each between the positive electrode line and the output node and including the power semiconductor device and the freewheeling diode connected in antiparallel,
wherein the at least one lower arm includes a plurality of lower arms each between the negative electrode line and the output node and including the power semiconductor device and the freewheeling diode connected in antiparallel, and
wherein the snubber resistor is the only snubber resistor of the power semiconductor module.

* * * * *